United States Patent [19]

Casselman

[11] Patent Number: 5,802,290
[45] Date of Patent: *Sep. 1, 1998

[54] COMPUTER NETWORK OF DISTRIBUTED VIRTUAL COMPUTERS WHICH ARE EAC RECONFIGURABLE IN RESPONSE TO INSTRUCTION TO BE EXECUTED

[75] Inventor: Steven M. Casselman, Reseda, Calif.

[73] Assignee: Virtual Computer Corporation, Reseda, Calif.

[*] Notice: The term of this patent shall not extend beyond the expiration date of Pat. No. 5,684,980.

[21] Appl. No.: 764,029

[22] Filed: Dec. 12, 1996

Related U.S. Application Data

[63] Continuation-in-part of Ser. No. 685,158, Jul. 23, 1996, Pat. No. 5,684,980, which is a continuation of Ser. No. 357,059, Dec. 14, 1994, abandoned, which is a continuation of Ser. No. 922,167, Jul. 29, 1992, abandoned.

[51] Int. Cl.$^6$ .................................................. G06F 9/00
[52] U.S. Cl. ...................... 395/200.31; 395/376; 395/500; 395/406
[58] Field of Search .................... 395/200.31, 200.32, 395/200.33, 406, 500, 376

[56] References Cited

U.S. PATENT DOCUMENTS

| | | | |
|---|---|---|---|
| 4,130,865 | 12/1978 | Heart et al. .................... | 395/200.31 |
| 4,462,075 | 7/1984 | Mori et al. ..................... | 395/200.32 |
| 5,243,698 | 9/1993 | May ................................ | 395/200.31 |
| 5,341,478 | 8/1994 | Travis, Jr. et al. ............... | 395/200.33 |
| 5,381,534 | 1/1995 | Shi .................................. | 395/200.33 |
| 5,506,962 | 4/1996 | Orimo et al. ..................... | 395/200.32 |
| 5,684,980 | 11/1997 | Casselman ....................... | 395/500 |

OTHER PUBLICATIONS

Athanas et al., *An Adaptive Hardware Machine Architecture and Compiler for Dynamic Processor Reconfiguration*, IEEE 1991, pp. 397–400.

Dillien, Paul C., Adaptive Hardware Becomes a Reality using Electrically Reconfiguration arrays (ERAs), IEE Colloquium on 'User–Configuration Logic–Technology and Applicaions' (Digest No. 056), 1991, pp. 2/1–10.

Hastie et al., The Implementation of Hardware Subroutines on Field Programmable Gate Arrays, IEEE 1990 Custom Integrated Circuits Conference, 1990, pp. 31.4.1 to 31.4.4.

*Primary Examiner*—Richard L. Ellis
*Attorney, Agent, or Firm*—Michaelson & Wallace

[57] ABSTRACT

A virtual network consists of many distributed virtual computers interconnected over a communication network of individual links, such as optical fibers or electrical conductors, for example. Each distributed virtual computer has at least two ports connected over respective links to other respective distributed virtual computers on the network. Each distributed virtual computer is connected to or resident within its own host, each host typically being a conventional computer such as a personal computer or a work station, for example, although at least one of the hosts may itself be another virtual computer. Each distributed virtual computer has reconfigurable logic elements such as an FPGA or an array of FPGAs.

28 Claims, 18 Drawing Sheets

COMPUTER NETWORK OF DISTRIBUTED VIRTUAL COMPUTERS WHICH ARE EAC RECONFIGURABLE IN RESPONSE TO INSTRUCTION TO BE EXECUTED

BACKGROUND OF THE INVENTION

Related Applications

This application is a continuation-in-part of U.S. application Ser. No. 08/685,158 filed Jul. 23, 1996 entitled "FPGA Virtual Computer for Executing a Sequence of Program Instructions by Successively Reconfiguring a Group of FPGA in Response to Those Instructions" by Steven M. Casselman, now U.S. Pat. No. 5,684,980, which is a continuation of Ser. No. 08/357,059 filed Dec. 14, 1994 now abandoned which is a continuation of Ser. No. 07/922,167 filed Jul. 29, 1992 now abandoned.

DISCLOSURE OF THE CO-PENDING APPLICATION

The above-referenced co-pending parent application discloses a virtual computer consisting of a reconfigurable control section and a reconfigurable computation array. Preferably, the reconfigurable control section is a relatively small array of interconnected field programmable gate arrays (FPGAs), while the reconfigurable computation array is a relatively large array of interconnected FPGAs whose configurations are governed by the control section. When power is first turned on, the control section automatically configures itself to emulate a microprocessor suitable for rapidly re-configuring the computation array in response to each new instruction to be carried out or executed. (The term "instruction" as understood herein is generic and can refer to either an individual instruction of a program, a group of instructions, an algorithm, a sub-routine or a program.) Preferably, the control section compiles each new instruction (e.g., an individual instruction of a program, a group of instructions, an algorithm, a sub-routine or a program) by generating therefrom respective sets of configuration bits for respective ones of the FPGAs in the computation array, and then causing those computation array FPGAs to be reconfigured accordingly. The advantage is that such a virtual computer has far greater speed than a conventional computer, as explained more fully in the above-referenced application. While the above-referenced application discloses an implementation employing many FPGAs in both the computation array and in the control section, other implementations may be carried out using a smaller number of FPGAs. For example, a limited application could suffice with only a single FPGA in the control section and a single FPGA in the computation array.

BACKGROUND ART

Computer networks of the type usually referred to as "local area networks" or LANs are well-known in the art, one of the best known LANs being the Ethernet™ LAN. Such networks have many uses such as, for example, permitting instant communication among co-workers at respective terminals or nodes of the network. Each terminal or node may be a personal computer or a work station. Another use of an LAN is to emulate a supercomputer by joining many work stations over an LAN. A fundamental problem with such a network is that the node or terminal (a personal computer, work station or the like) must act as a host and perform a number of required tasks, which necessarily consumes the resources of the host, or postpones such tasks while the host completes higher-priority tasks. The required tasks can include performing the network protocol tasks, converting data on the network (typically serial error correction encoded compressed data blocks) into parallel 16-bit words for processing in the host, and vice-versa, decoding data packet headers, and so forth. Because of the demand on the host's limited processing resources, these tasks are necessarily performed at a limited speed, so that the rate at which data can be communicated over the LAN is limited. Moreover, from the point of view of the host's user, participation in the network requires some sacrifice of the host's resources to network-related tasks.

SUMMARY OF THE INVENTION

The invention is embodied in a virtual network consisting of many distributed virtual computers interconnected over a communication network of individual links, such as optical fibers or electrical conductors, for example. Each distributed virtual computer has at least two ports connected over respective links to other respective distributed virtual computers on the network. Each distributed virtual computer is connected to or resident within its own host, each host typically being a conventional computer such as a personal computer or a work station, for example, although at least one of the hosts may itself be another virtual computer. Each distributed virtual computer has reconfigurable logic elements such as an FPGA or an array of FPGAs. At power-up, at least one of the FPGAs in at least one of the distributed virtual computers is automatically configured (e.g., from instructions stored in a non-volatile read-only memory or from instructions from a host) into a microprocessor-like device which then configures one or some "control" FPGAs or "control" portions of single FPGAs in the various distributed virtual computers to give them control or "compiling" capability over the remaining FPGA resources, which act as a computation FPGA array. Such control or compiling capability means that the "control" FPGA (or the "control" portion of a single FPGA) so configured can react to instructions received from a host or from other nodes on the network to re-configure FPGA elements in the computation array to carry out a required task. Thus, the control FPGA (or FPGAs) in the distributed virtual computer can function in the manner of the control section of the virtual computer described in the above-referenced co-pending application to compile received instructions or algorithms into configuration bit files and reconfigure the computation array FPGA elements in accordance with the configuration bit files to optimally carry out each instruction or algorithm. Alternatively, the host computer can assume some of the reconfiguring or compiling tasks. Such a network of distributed virtual computers is referred to herein as a virtual network.

In one embodiment, each host is connected to a node of a conventional LAN as well as being connected to a distributed virtual computer or node of the virtual network, so that there are two networks interconnecting the same set of host computers.

Each distributed virtual computer can be configured to perform all of the network node tasks for the virtual network, which are the same type of tasks discussed above concerning the conventional network or LAN, including decompression, decoding and so forth. Thus, the virtual computer network does not consume the resources of the host computer for such tasks, a significant advantage over conventional networks. Another advantage is that the FPGAs of the distributed virtual computers can be optimally configured to perform specific difficult tasks at extremely high speeds, such as translation of packet headers at gigabit rates, something a conventional computer is generally incapable of doing.

Since each distributed virtual computer can be reconfigured at any time for specific tasks, the virtual network can rapidly transition between various operating modes as needed. For example, in one mode at least some of the host computers of the network can be slaved to one or more of the distributed virtual computers to solve a large problem, so that the resources (e.g., memory and processing capability) of all hosts are employed in solving the problem. In other cases, the distributed virtual computers themselves can be reconfigured to perform certain computational (as contrasted with the required node tasks).

Each distributed virtual computer can be reconfigured in response to requests from either the host computer or from other nodes (distributed virtual computers) on the virtual network. Moreover, the compiling and reconfiguring of a given distributed virtual computer may be carried out either by its own FPGA(s) or by other distributed virtual computers in the virtual network or by a host.

DETAILED DESCRIPTION OF THE PREFERRED EMBODIMENTS

Figure 1:
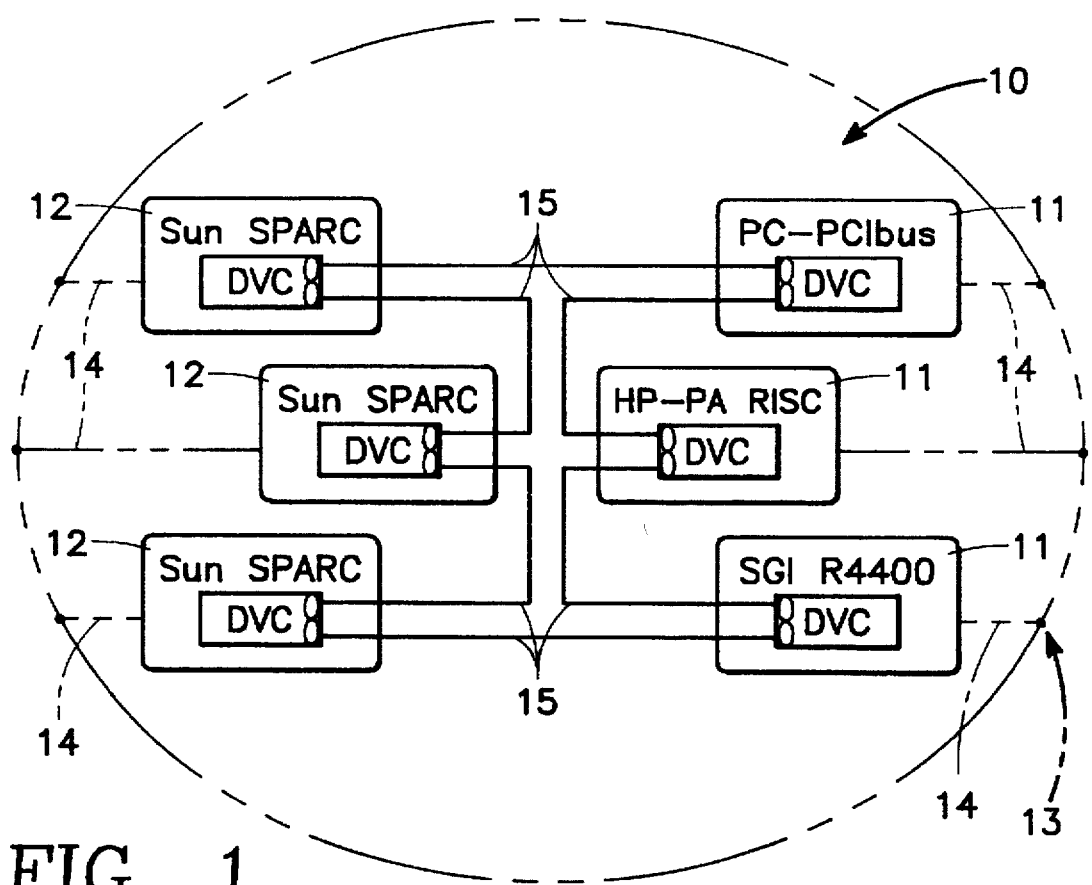
FIG. 1 is a schematic block diagram of a virtual computer network consisting of distributed virtual computer nodes interconnected by optical fiber links.

FIG. 1 illustrates a virtual computer network 10 in accordance with the invention. The virtual computer network consists of plural distributed virtual computers 11 interconnected by communication links 15. Preferably, each communication link 15 is a fiber optic link. Each distributed virtual computer is resident in or connected to a corresponding host 12. Each host 12 can be a computer, such as a work station or a personal computer or the like, or another device such as a bus controller or a distributed input/output device or a peripheral device, such as a printer for example. Typically, however, each host 12 is a computer. The hosts 12 may be interconnected by a conventional local area network 13 including communication links 14. The local area network 13 is independent of the virtual network 10.

Figure 2:
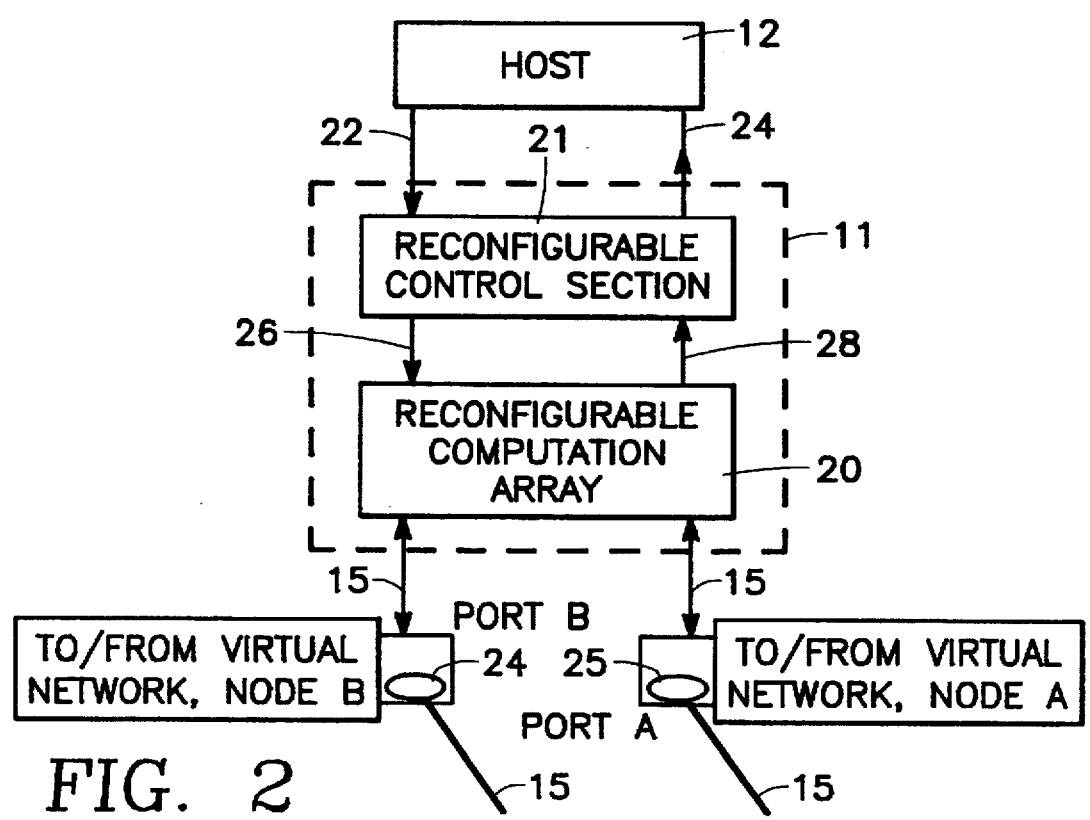
FIG. 2 is a simplified schematic block diagram of a distributed virtual computer in the network of FIG. 1.

FIG. 2 illustrates a preferred architecture of a typical distributed virtual computer 11. The distributed virtual computer 11 includes a reconfigurable computation array 20 of FPGA elements under the control of a reconfigurable control section 21 of FPGA elements. The control section 21 has an input port 22 to receive communications from its host and an output port 24 to send communications to its host. Further, a configuration control output link 26 carries communications from the control section 21 to the computation array 20 while an optional configuration control reply link 28 can carry communications from the computation array 20 back to the control section 21. Reference is made to the detailed description below of a virtual computer corresponding to the above-referenced co-pending application in which a reconfigurable control section corresponding to the reconfigurable control section 21 of FIG. 2 consists of many interconnected FPGAs. Also in the virtual computer of the co-pending application, a reconfigurable computation array corresponding to the reconfigurable computation array 20 of FIG. 2 consists of an even larger number of interconnected FPGAs. Thus, in one embodiment, the computation array 20 of FIG. 2 consists of a number of interconnected FPGAs while the control section 21 of FIG. 2 consists of a smaller number of interconnected FPGAs. However, in a preferred embodiment of the distributed virtual computer of FIG. 2, the reconfigurable control section 21 has a single FPGA while the reconfigurable computation array 20 has a single FPGA, as will be described later in this specification. The distributed virtual computer of FIG. 2 further includes at least two network ports 24, 25 each preferably including a conventional fiber optic connector for connection to a respective one of the fiber optic links 15. Preferably, each port 24, 25 is connected via a separate link 15 to a different one of the other distributed virtual computers 11 in the virtual network 10, as indicated in FIG. 1.

A description corresponding to the above-referenced co-pending application is given later in this specification concerning how FPGA elements in the control section 21 can be configured at the time the system is first turned on to emulate a microprocessor programmed to compile instructions into configuration bit files with which to reconfigure FPGA elements in the computation array 20 to carry out each instruction or group of instructions. Initial configuration of the control section 21 can be carried out by the corresponding host 120, for example.

In order to implement communications on the virtual network 10 of FIG. 1, some of the instructions which the computation array 20 could be configured to carry out would correspond to network protocol support tasks, for example, or any tasks required to be carried out by a node in a computer network. This relieves the host 12 of any of the burdens associated with maintaining the virtual network 10. One advantage of this feature is that since the computation array is dynamically reconfigurable, each of the virtual network nodes or distributed virtual computers 11 can be configured to support different network protocols at different times or to support multiple network protocols at any time.

A simple use of the virtual network 10 is to simply communicate data between different host computers 12 without requiring any of the hosts to perform tasks related to network communication or protocol. A slightly more sophisticated use of the virtual network 10 is for each distributed virtual computer to perform some pre-processing or screening of incoming data on behalf of the host computer 12.

The computation array 20 can be configured so as to be ready to perform selected tasks on demand or can be reconfigured "on the fly" to perform tasks as the need arises. For example, in a distributed processing mode of the invention, different nodes or distributed virtual computers 11 in the network 10 can be dedicated to perform different computational or problem-solving tasks or processes without necessarily consuming the resources of the respective hosts 12. In such a distributed processing mode, operand data (data to be operated upon by certain ones of the different processes stored on the different nodes) would travel through the network 10 in packets, each packet having a header designating which one or ones of the pre-stored processes is to operate on the data in that packet. Each node or distributed virtual computer 11 would be configured so as to be able to perform packet header translation. The packet header can designate its destination as a particular node or type of node. For example, from its translation of the packet header, each node or distributed virtual computer 11 would determine whether the data in the packet is to be operated upon by a process which that particular node has been configured to perform. If not, the node 110 simply passes the received packet along to the next node in the network. If so, the node or distributed virtual computer 11 stores the packet as received from the network 10 and then operates upon it with the process which that node has been configured to perform or execute to produce result data. The distributed virtual computer can then form a new data packet from the result data with an appropriate packet header designating the nature of the result data (and any process which is to be performed thereon) and output the new data packet onto the virtual network 10.

Because each node or distributed virtual computer 11 is versatile and reconfigurable, its configuration can be changed in response to requests or instructions received not only from the host 120 but also received over the virtual network 10. Thus, a packet of data received from the network 10 may contain not only operand data to be processed in accordance with a particular process with which the node 11 has been configured to perform, but may also contain instructions for then reconfiguring that same node so as to be able to perform another process. Thus, the different processes stored in different nodes 110 can change dynamically as data packets flow through the network 10. A large algorithm can be executed by the network as a whole by dividing it into sub-algorithms requiring different nodes 11 to perform different processes on different operand data packets at different times as different packets are received at different nodes 11. The data packets can contain operand data and instructions for generating new packet headers for the resultant data as well as instructions for reconfiguring the node itself. The instructions can be conditioned upon the immediate outcome of the process executed in the node. For example, the instructions for reconfiguring the node (or for forming a new packet header) can be in the alternative, with different alternatives being conditioned upon different values being obtained in the resultant data. With each operation of a process by a node 11, a result data packet is produced with the new packet header.

While the computation array 20 of each node 11 can perform a given process without using any other resources, in another mode of the invention, the node 11 also uses certain resources of its host 12 in carrying out a particular process. For example, the node 11 may store certain intermediate or final computation results in the memory of its host 12, or it may use the results of computations performed by the host 12. In yet another mode, a node 11 may request through other nodes to use the resources of their hosts 12, such as memory or processing capabilities. The user accomplishes this by creating the instructions communicated on the virtual network which the control section 21 can respond to appropriately (by causing the node 11 to communicate the appropriate requests to its host 12 or to other nodes 11 on the network 10). In this manner selected ones of the hosts 12 can be slaved to one or more of the nodes or distributed virtual computers 110 to carry out a large algorithm.

The reverse is also feasible, in that the host 12 can send instructions down to the control section 21 of its resident distributed virtual computer 11 to use the distributed virtual computer as a slave to perform certain computations or tasks which the host 12 assigns to it, so that the distributed virtual computer 11 or node can be slaved to its own host 12. Moreover, a given host 12 can request through its resident distributed virtual computer 11 for other distributed virtual computers 110 in the virtual network 10 to be slaved as well.

The computation array 20 may also be configured to translate packet headers at gigabit rates, a feat which a typical personal computer or even a work station is not capable of accomplishing. This advantage follows from the low latency with which the distributed virtual computer 11 operates: the computation array 200 can be configured to carry out the entire packet translation task, so that the process need not wait for individual instructions to be fetched one-by-one in the manner of a conventional computer.

Figure 3:
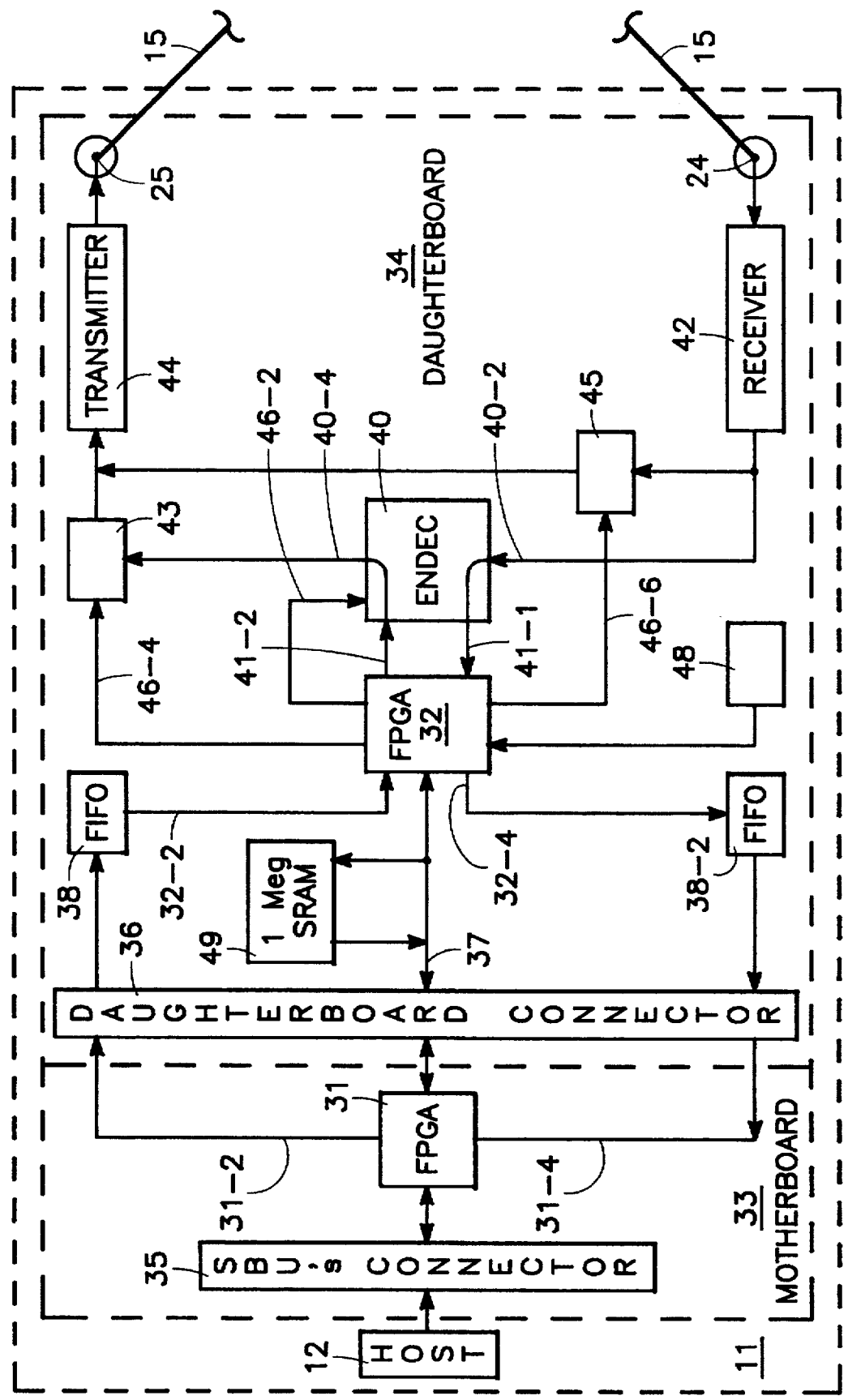
FIG. 3 is a schematic block diagram of a preferred embodiment of the distributed virtual computer of FIG. 2.

While the control section 21 and computation array 20 of each distributed virtual computer 11 can comprise many FPGAs in the manner of the co-pending application as described in detail below, FIG. 3 illustrates a preferred embodiment in which the control section 21 and computation array 20 of FIG. 2 is a single FPGA 31, 32, respectively. While the following description of FIG. 3 contemplates the use of the FPGA 31 as the control section and the FPGA 32 as the computation array, these uses may be reversed. Moreover, the control section need not necessarily consume an entire FPGA and instead may constitute only a portion of one of the FPGAs 31, 32, the remaining portion of the one FPGA and the entirety of the other being available for use as the computation array.

In FIG. 3, the distributed virtual computer 11 is divided into a mother board 33 on which the mother FPGA 31 resides and a daughter board 34 on which the daughter FPGA 32 resides. The mother board 33 supports a bi-directional 32-bit S-bus connector 35 providing connection between the mother FPGA 31 and the host computer 12. The daughter board 34 supports a daughter board connector 36. The mother FPGA 31 is connected through the daughter board connector 36 to the daughter FPGA 32 via a bi-directional 32-bit bus 37. A nine-bit output port 31-2 of the mother FPGA 31 is connected to a nine-bit input port 32-2 of the daughter FPGA 32 via the daughter board 36 and through an output first-in-first-out (FIFO) buffer 38 on the daughter board 34. A nine-bit output port 32-4 of the daughter FPGA 32 is connected via the daughter board connector 36 to a nine-bit input port 31-4 of the mother FPGA 31 through an input FIFO buffer 38-2 on the daughter board 34. An encoder/decoder 40 on the daughter board 34 decodes data received from the network 10 on its input port 40-2 and sends it on an eight-bit input bus 41-1 to eight input pins of the daughter FPGA 32. The encoder/decoder 40 also encodes data output by the FPGA 32 on eight output pins thereof to an eight-bit output bus 41-2 and produces the encoded data at its output port 40-4.

The input port 40-2 of the encoder/decoder 40 is connected to the output of a conventional receiver/demodulator 42 whose input is connected to the port or fiber optic connector 24. The output port 40-4 of the encoder/decoder 40 is connected through a Q-switch 43 to the input of a transmitter 44 whose output is connected to the port or fiber optic connector 25. A bypass Q-switch 45 is connected between the output of the receiver 42 and the input of the transmitter 44. The daughter FPGA 32 controls the encoder/decoder 40, the Q-switch 43 and the bypass Q-switch 45 via control lines 46-2, 46-4, 46-6, respectively. Communication of data onto the network is enabled via the control lines 46-2, 46-4 by enabling the encoding function and closing the Q-switch 43. In order for data packets in the network to bypass the node, the Q-switch 45 is closed via the control line 46-6. In this latter mode, the daughter FPGA 32 can continue to monitor the data packets passing through the bypass Q-switch 45 since the encoder/decoder input port 40-2 remains connected to the output of the receiver 42. The two Q-switches are operated in tandem, so that when one is closed the other is open. Clock recovery of the incoming data packets is facilitated by a programmable oscillator 48 connected to a clock input of the daughter FPGA 32. Additional memory or scratch pad memory capability is provided by a one megabyte S-RAM 49 having its input and output ports connected to the 32-bit bidirectional bus 37.

In a typical operation of the embodiment of FIG. 3, the host computer 12 configures the mother FPGA 31 so that the mother FPGA 31 can compile user instructions or requests into configuration bit files by which the daughter FPGA 32 (and/or portions of the mother FPGA 31) can be reconfigured to enable execution or performance of those instructions or requests. Thereafter, the mother FPGA 31 can receive such instructions or requests from either the host computer 12 or from the network 10 (via the receiver 42 and the daughter FPGA 320 and cause the daughter FPGA 32 to be reconfigured and carry out those instructions or requests as they arise. In another mode, data packets received via the virtual network 10 can contain instructions which configure the daughter FPGA 32 as a control section which actively reconfigures the mother FPGA 31 in response to received instructions, so that the roles of the two FPGAs can be reversed. In this latter case, the mother FPGA can output the results of its computations to either the host 12 or return them to the virtual network 10.

The encoder/decoder 40 is of the conventional type required for local area network communications in which 8-bit byte parallel data is encoded for transmission as 10-bit bit-serial error correction encoded blocks. For decoding, the encoder/decoder performs the reverse of the encoding process. The transmitter 44 converts the 10-bit bit-serial encoded data into an optical signal for transmission on the fiber optic links 15, while the receiver 42 converts a received optical signal into an electrical 10-bit bit-serial data for decoding. Alternatively, the links 15 are electrical rather than optical and the transmitter and receiver 44, 42 each produce an electrical rather than an optical signal.

In the embodiment of FIG. 3, it is assumed that the virtual network 10 is a ring type of network in which each node has a pair of ports, one port for receiving data from an "upstream" node and the other port for transmitting data to a "down-stream" node of the network. However, other network architectures not in general use may be employed in which at least some of the ports may be bi-directional and in which each node can have more than two ports. In this case, a third port could be added to the daughter board 34 in addition to the ports 24, 25.

Figure 4:
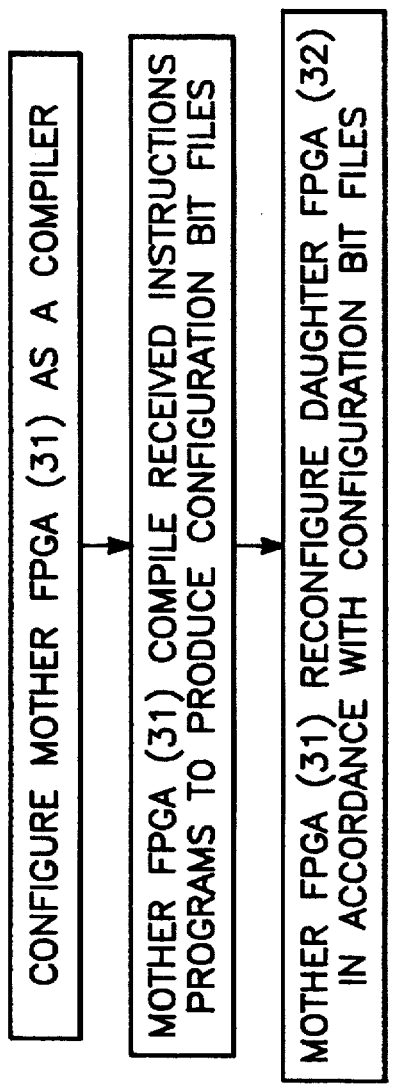
FIG. 4 is a block diagram of a method of operating the embodiment of FIG. 3.
Figure 5:
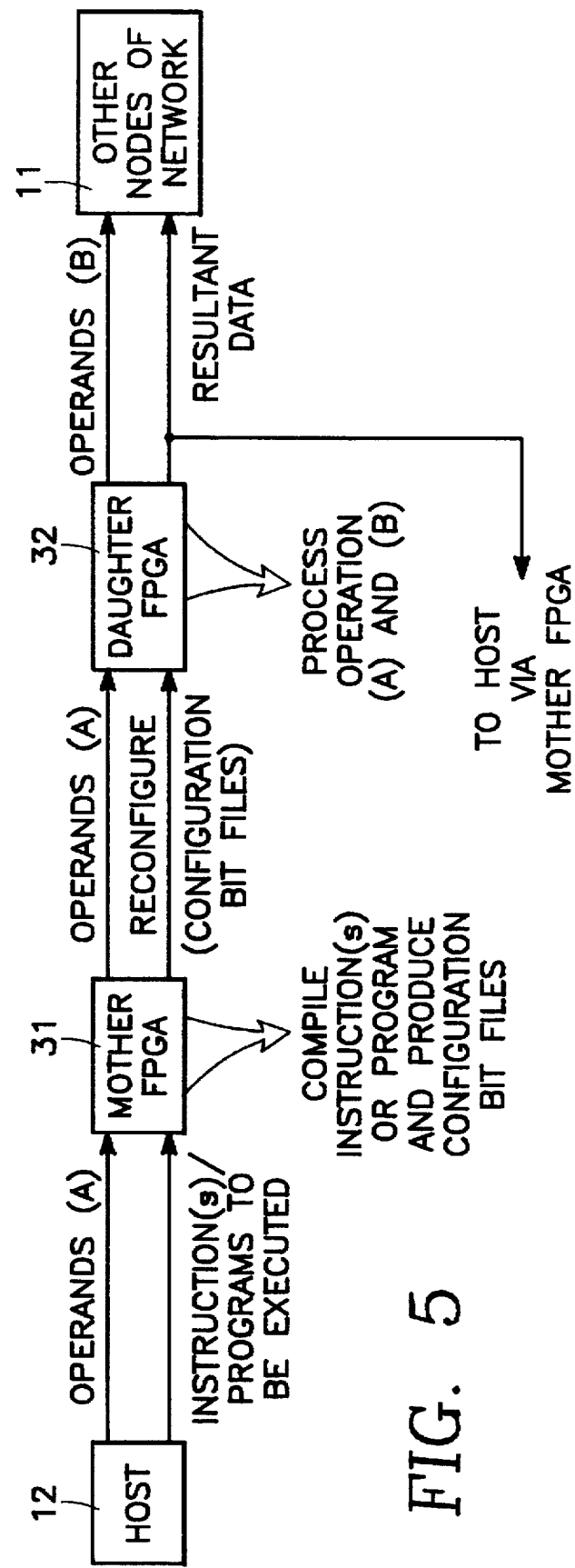
FIG. 5 is a flow diagram corresponding to FIG. 4 illustrating the flow of control and data signals through the embodiment of FIG. 3.

FIG. 4 is a block diagram of a method of operating the embodiment of FIG. 3 and FIG. 5 is a corresponding flow diagram illustrating the flow of control and data signals through the embodiment of FIG. 3. In FIG. 4, the mother FPGA 31 is initially configured, either from instructions stored in a non-volatile memory or from instructions from the host 12, to become a machine which can compile a program or algorithm into configuration bit files with which to dynamically reconfigure the daughter FPGA 32 with each new program or algorithm to be executed. FIG. 5 illustrates how the embodiment of FIG. 3 may be operated following the initial steps of FIG. 4. In FIG. 5, the host 12 (and possibly other nodes 11 of the virtual network 10) send to the mother FPGA 31 programs, algorithms or instructions defining processes to be carried out on operand data. In response, the mother FPGA 31 compiles such programs, algorithms or instructions into configuration bit files and causes the daughter FPGA 32 to be reconfigured in accordance therewith. In the meantime, operand data is sent to the daughter FPGA 32 from the host 12 (via the mother FPGA 31) and/or from other nodes of the network 10 (via the network links). The daughter FPGA 32 then carries out the desired process on the operand data to produce resultant data which it then sends to either or both the host 12 (via the mother FPGA 31) or to the other nodes of the network. In this operation, the host 12 may be slaved to the process carried out in the daughter FPGA 32 in that some of the resultant data sent to the host 12 may be intermediate results stored in the host 12 as scratch pad memory and which is returned to the daughter FPGA 32 as operand data when the daughter FPGA 32 is ready. The mother FPGA 31 may receive from the other nodes (via the daughter FPGA 32 and the network links) packet headers requiring translation. As discussed herein above, such packet headers may define the type of process to be carried out next on operand data contained in the concurrent data packet. In this case the mother FPGA 31 translates the packet headers (or configures the daughter FPGA to do so) and can either configure the daughter FPGA 32 to carry out the process specified in the translation of the packet header or cause the corresponding data packet to be passed along in the network to the next node already configured to carry out the desired process.

Figure 6:
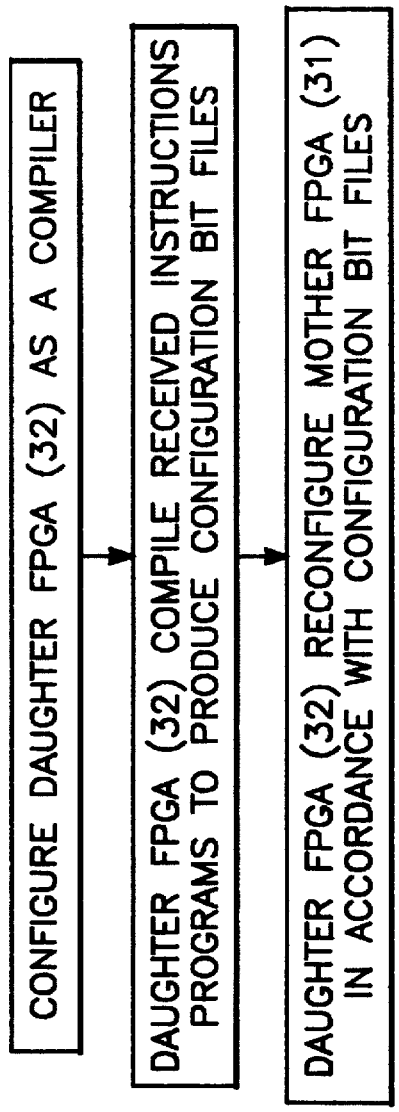
FIG. 6 is a block diagram of an alternative method of operating the embodiment of FIG. 3.
Figure 7:
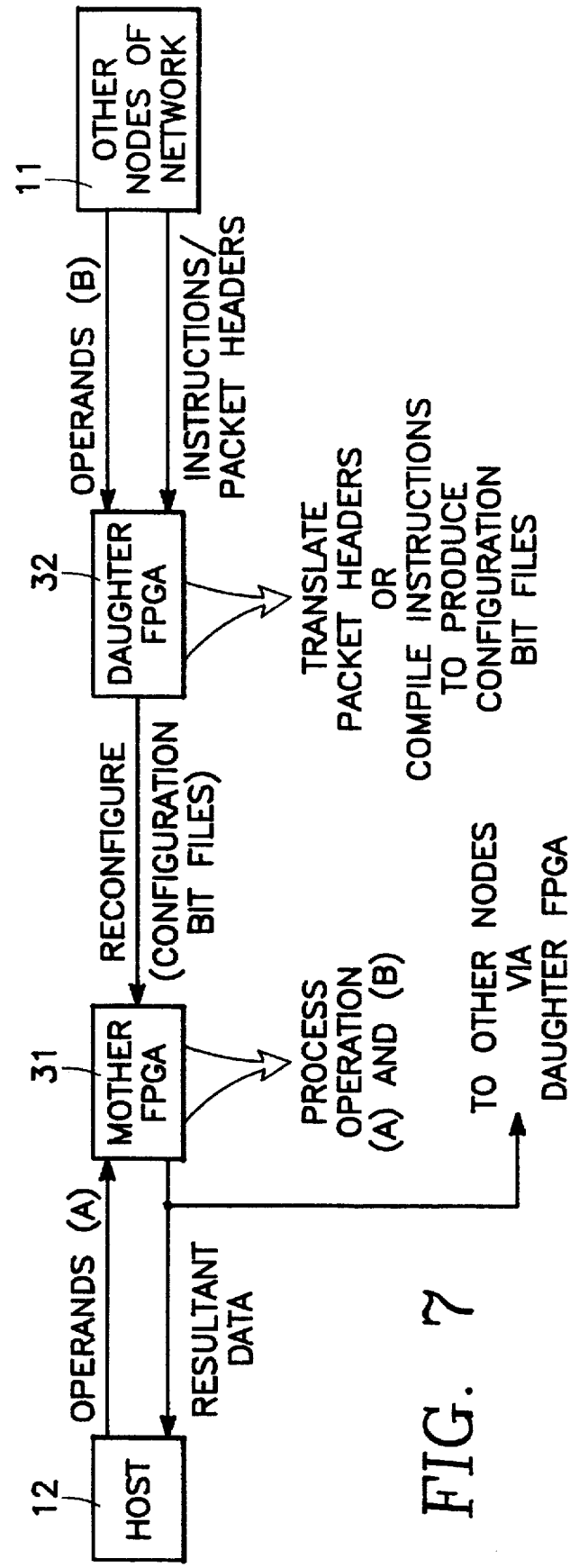
FIG. 7 is a flow diagram corresponding to FIG. 6 illustrating the flow of control and data signals through the embodiment of FIG. 3.

FIG. 6 is a block diagram of a method of operating the embodiment of FIG. 3 and FIG. 7 is a corresponding flow diagram illustrating the flow of control and data signals through the embodiment of FIG. 3. In FIG. 6, the daughter FPGA 32 is initially configured, either from instructions stored in a non-volatile memory or from instructions from the host 12, to become a machine which can compile a program or algorithm into configuration bit files with which to dynamically reconfigure the mother FPGA 31 with each new program or algorithm to be executed. FIG. 5 illustrates how the embodiment of FIG. 3 may be operated following the initial steps of FIG. 4. In FIG. 5, the other nodes 11 of the virtual network 10 (and/or possibly the host 12) send to the daughter FPGA 32 programs, algorithms or instructions defining processes to be carried out on operand data. In response, the daughter FPGA 32 compiles such programs, algorithms or instructions into configuration bit files and causes the mother FPGA 31 to be reconfigured in accordance therewith. In the meantime, operand data is sent to the mother FPGA 31 from the host 12 and/or from other nodes of the network 10 (via the network links and the daughter FPGA 32). The mother FPGA 31 then carries out the desired process on the operand data to produce resultant data which it then sends to either or both the host 12 (via the daughter FPGA 32) or to the other nodes of the network. In this operation, the host 12 may be slaved to the process carried out in the mother FPGA 31 in that some of the resultant data sent to the host 12 may be intermediate results stored in the host 12 as scratch pad memory and which is returned to the mother FPGA 31 as operand data when the mother FPGA 31 is ready. What the daughter FPGA 32 receives from the other nodes via the network links may be packet headers requiring translation. As discussed herein above, such packet headers may define the type of process to be carried out next on operand data contained in the concurrent data packet. In this case the daughter FPGA 32 translates the packet headers (or configures the mother FPGA 31 to do so) and can either configure the mother FPGA 31 to carry out the process specified in the packet header or cause the corresponding data packet to be passed along in the network to the next node already configured to carry out the desired process.

Figure 8:
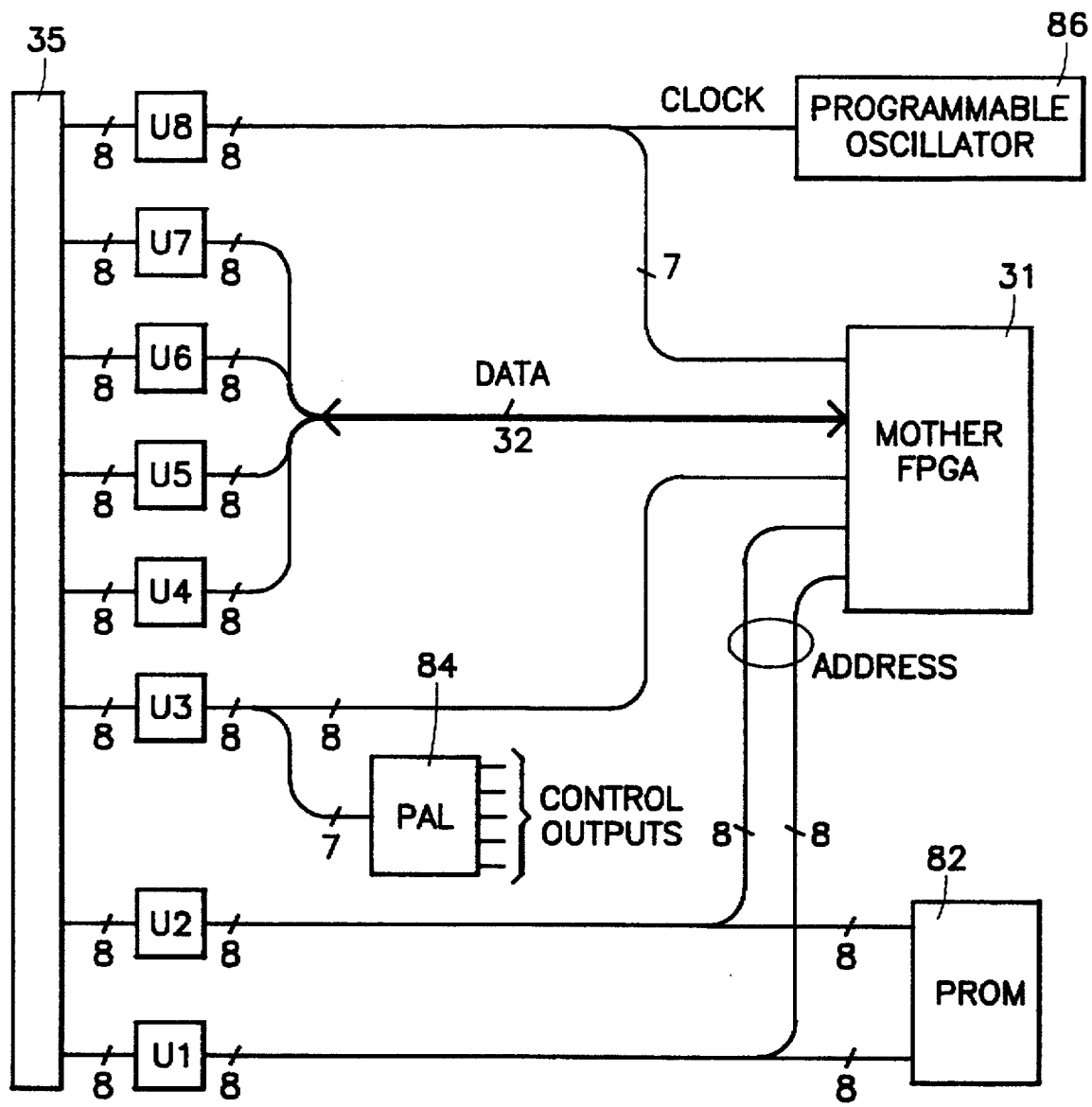
FIG. 8 is a schematic block diagram of one implementation of the embodiment of FIG. 3.
Figure 9:
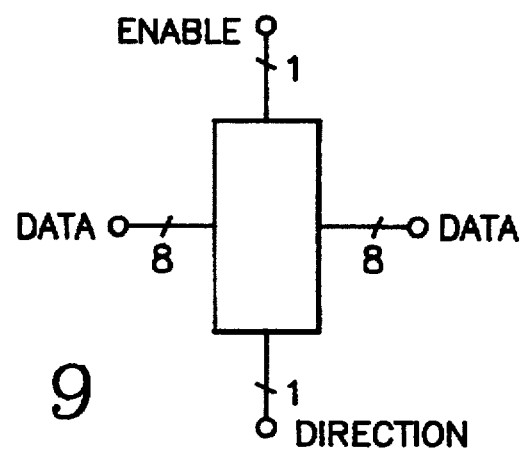
FIG. 9 is a block schematic representation of a typical 8-bit buffer employed in the implementation of FIG. 8.

The embodiment of FIG. 3 may be implemented in the manner illustrated, with the mother FPGA 31 being connected directly to the S-bus connector 35, provided the mother FPGA 31 is a high speed FPGA such as Xilinx FPGA part no. XC4028EX sold by Xilinx, Inc. However, if a slower FPGA is employed instead (such as Xilinx FPGA part no. XC4013E sold by Xilinx, Inc.), then data and address flow between the S-bus connector 35 and the mother FPGA 31 must be buffered in the manner illustrated in FIG. 8. While any appropriate one of various buffering schemes may be employed, in the buffering scheme of FIG. 8 32 bits of data flow bidirectionally between the connector 35 and the FPGA 31 through four 8-bit bidirectional buffers U4, U5, U6 and U7. Sixteen address bits are buffered unidirectionally (to the FPGA 31) through 8-bit unidirectional buffers U1 and U2 and three additional address bits are similarly buffered through a buffer U8. The address bits from the buffers U1 and U2 are also applied to the inputs of a programmable read-only memory (PROM) 82. Data direction control through the bidirectional buffers U4–U7 is effected through an 8-bit buffer U3 through which eight bits are connected from the FPGA 31 to the connector 35, seven of the 8bits being connected also to a programmable array logic (PAL) device 84 whose outputs are connected to the ENABLE and DIRECTION control inputs of the bidirectional buffers U4–U7. The ENABLE and DIRECTION control inputs of a typical 8-bit bidirectional buffer are illustrated in FIG. 9. In addition to the three address bits buffered by the 8-bit buffer U8, this buffer also buffers certain one-bit S-bus control signals, including ADDRESS STROBE, CLOCK, BUS GRANT, BUS REQUEST and BUS SELECT. The CLOCK bit of U8 is connected to the output of a programmable oscillator 86.

Figure 10:
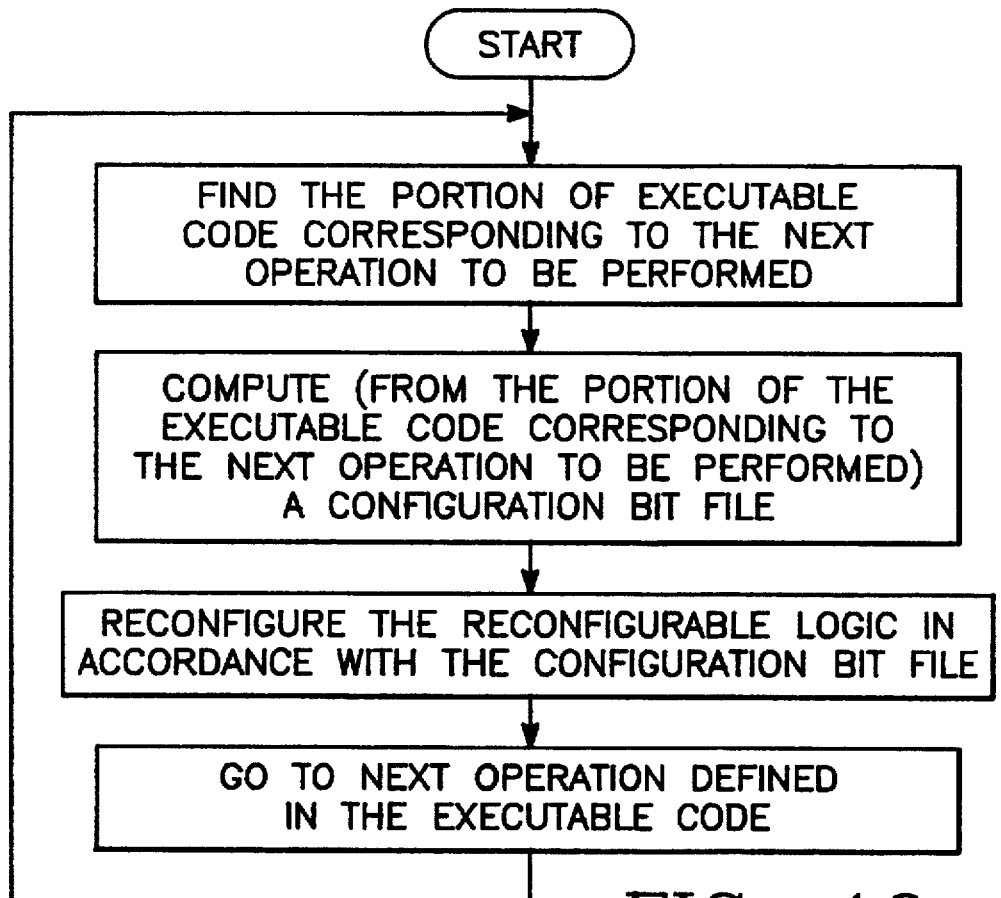
FIG. 10 is a block flow diagram illustrating the general method of the invention disclosed in the co-pending parent application.

The invention has been described in the above-referenced co-pending application with reference to embodiments in which executable operations or instructions of a user program are compiled into configuration bit files by certain reconfiguration software packages run either by the host or by the control section of FPGAs. Thus, the general concept disclosed in the above-referenced co-pending application is a method of operating as a real computer a reconfigurable logic array such as an FPGA (or plural FPGAS) of the type which are reconfigurable in accordance with a configuration bit file generated by the reconfiguration software package. The general method (illustrated in FIG. 10) performs an executable code defining a sequence of operations to be executed in sequence by executing the executable code operation-by-operation in order of the sequence. In particular, at the time of the execution of at least one of the operations of the sequence, the execution is accomplished by computing exclusively from the portion of the executable code defining the one operation a corresponding configuration bit file representative of the one operation in accordance with the reconfiguration software package or algorithm. Thereafter, the reconfigurable logic is reconfigured in accordance with the corresponding configuration bit file. The advantage is that the reconfigurable logic array operated in this manner becomes a real computer, a device capable of performing any previously undefined operation which a user may define to the computer at the time a corresponding instruction is to be executed in a sequence of instructions, and not before. That "any" such operation may be performed is limited only by the capability of the reconfiguration software package to represent any operation as an appropriate configuration bit file. Thus, this method can use the complete set of all possible configuration bit files of which the reconfiguration software package is capable of generating, so that the resulting computer (or "virtual computer") is as versatile as any conventional machine in carrying out any previously undefined process or operation.

This is to be contrasted with methods for operating reconfigurable logic elements which do not provide a real computer because their configuration bit files are generated a priori before the user begins using the machine. In one proposal, a limited set of configuration bit files is initially generated and stored at known addresses in a large memory (whose size limits the number of sets of configuration bit files thus stored). Thereafter, a user may begin using the machine, but must restrict his programs to those operations capable of being defined within the limited set of configuration bit files previously stored in the memory. Such a limitation prevents this inferior method from providing a true computer. This inferior method is disclosed by Hastie et al., "The Implementation of Hardware Subroutines on Field Programmable Gate Arrays," *Proceedings of the IEEE* 1990 *Custom Integrated Circuits Conference*, Boston, Mass., May 13–16, 1990, pages 31.4.1 through 31.4.4. In the publication by Hastie et al., a very limited number of configuration bit files are pre-loaded in a read-only memory and accessed by individual addresses of the memory, depending upon the type of operation to be run at a particular time. Thus the user of the Hastie et al. device must limit his operations to only those which are susceptible of being efficiently represented by the limited set of configuration bit files preloaded into the memory, a significant disadvantage.

The foregoing detailed description of the invention was made with reference to preferred embodiments in which the reconfiguration software is run for each operation or user instruction to compile it and thus obtain the requisite configuration bit file at the time of execution. As described, the reconfiguration software may be run in a host computer connected to the reconfigurable logic array or may be run in a processor-like configured control section of the reconfigurable logic array itself.

However, in another mode or species of the general method, at least some of the compiling of the user-instruction into a configuration bit file or precursor image thereof may have already been accomplished by the user himself in creating his program to be executed, the results (e.g., a paritally or fully computed configuration bit file compiled from a particular instruction or operation) having been inserted by the user into the executable program itself in lieu of the usual code. The user's executable program contains images of the successive operations to be performed, each image being a complete description in a programming language of the operation (e.g., a set of mathematical statements). The user may choose to compile at least one of these operation images into a corresponding configuration bit file for substitution into his program in lieu of the operation image. In this mode, the general method set forth above is just the same, including the step of "computing exclusively from the portion of the executable code defining the one operation a corresponding configuration bit file", but in this mode entails extracting the partially (or fully) compiled instruction from the executable code as a precursor image of the desired configuration bit file, rather than computing it completely from scratch. In this latter mode, as in the one described in the co-pending application, the configuration bit file is computed (compiled or extracted) at the time of execution exclusively from the contents of that portion of the user's executable code defining the particular instruction or operation to be executed. After a fully downloadable configuration bit file has been computed (compiled or extracted) from the portion of the user's executable code defining the current instruction, it is downloaded to the reconfigurable logic element or array to bring about the requisite reconfiguring. The advantage is the same in both modes of the method, in that the correct configuration bit file for the desired operation is computed from the user program at the time of execution of that operation, provided it exists in the complete set of all configuration bit files of which the reconfiguration software package is capable of generating. Thus, whatever configuration bit file is sufficient for carrying out the operation is obtained at the time of execution without limiting the user's choice of operations. Accordingly, the virtual computer function provided by the method has a versatility limited only by the capacity of the latest or best reconfiguration software package available at the time. Thus, in both the general method and in the latter species of the general method, a heretofore unmeasured (possibly infinite) number of choices of different operations may be executed in sequential order by the reconfigurable logic array in the manner of a true computer.

In a typical implementation of the latter species of the general method, the portion of the user's executable code representing a particular instruction or operation contains the results of running all components of the reconfiguration software package except the downloading routine. Thus, at the time of execution the method requires running at least the downloading function of the reconfiguration software package, as disclosed by Casselman et al., "Hardware Object Programming on A Reconfigurable Computer," 1994.

Co-Pending Application Description

Figure 11:
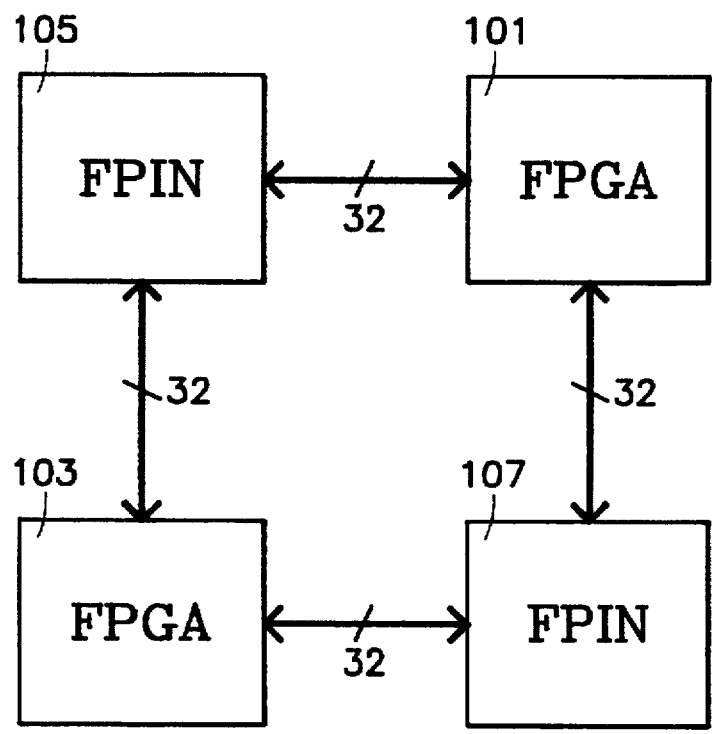
FIG. 11 is a simplified block diagram of an elementary cell of an array of FPGA's and FPIN's in accordance with the invention.

Referring now to FIG. 11, a basic cell or building block of a an array of FPGAs includes a pair of FPGAs 101, 103, which may be thought of as being located on opposite corners of a square, and a pair of FPINs 105, 107, which may be thought of as being located on the other opposing corners of the square. Each FPGA 101, 103 is connected to the two FPINs 105, 107, while each FPIN 105, 107 is connected to the two FPGAs 101, 103.

The internal logical architecture of each FPGA is reconfigurable to implement a user-selected algorithm or a portion of such an algorithm. Such reconfiguring may be achieved by processing a logical definition of the algorithm with a software package such as LDG software package distributed by the Supercomputing Research Center (SRC) to generate a file of configuration bits for each FPGA. Each FPGA is reconfigured by down-loading the corresponding configuration bit file into the FPGA, as will be described later in this specification. Each FPIN is reconfigured by using the bits specifying FPGA-to-FPGA connections in each configuration bit file produced by the LDG software package as an input to a software package such as FPID Pro developed by I-Cube Systems, Inc., to generate a file of configuration bits for each FPIN. Each FPIN is reconfigured by down-loading the corresponding configuration bit file into the FPIN, as will be described later in this specification. In this way, none of the internal logic resources of the FPGAs are wasted in effecting the FPGA-to-FPGA connections specified in the configuration bit files generated by the LDG software package.

In one implementation, each connection is between one bank of 32 user I/O pins of an FPGA and a corresponding bank of 32 user I/O pins of an FPIN, although the actual number of pins is a design choice. In this implementation, each FPGA is a Xilinx XC 4000 programmable gate array sold by Xilinx, Inc. at 2001 Logic Drive, San Jose, Calif. and each FPIN is an I-Cube IQ160 field programmable interconnect device sold by I-Cube Systems, Inc. at 2328-J Walsh Avenue, Santa Clara, Calif.

Figure 12:
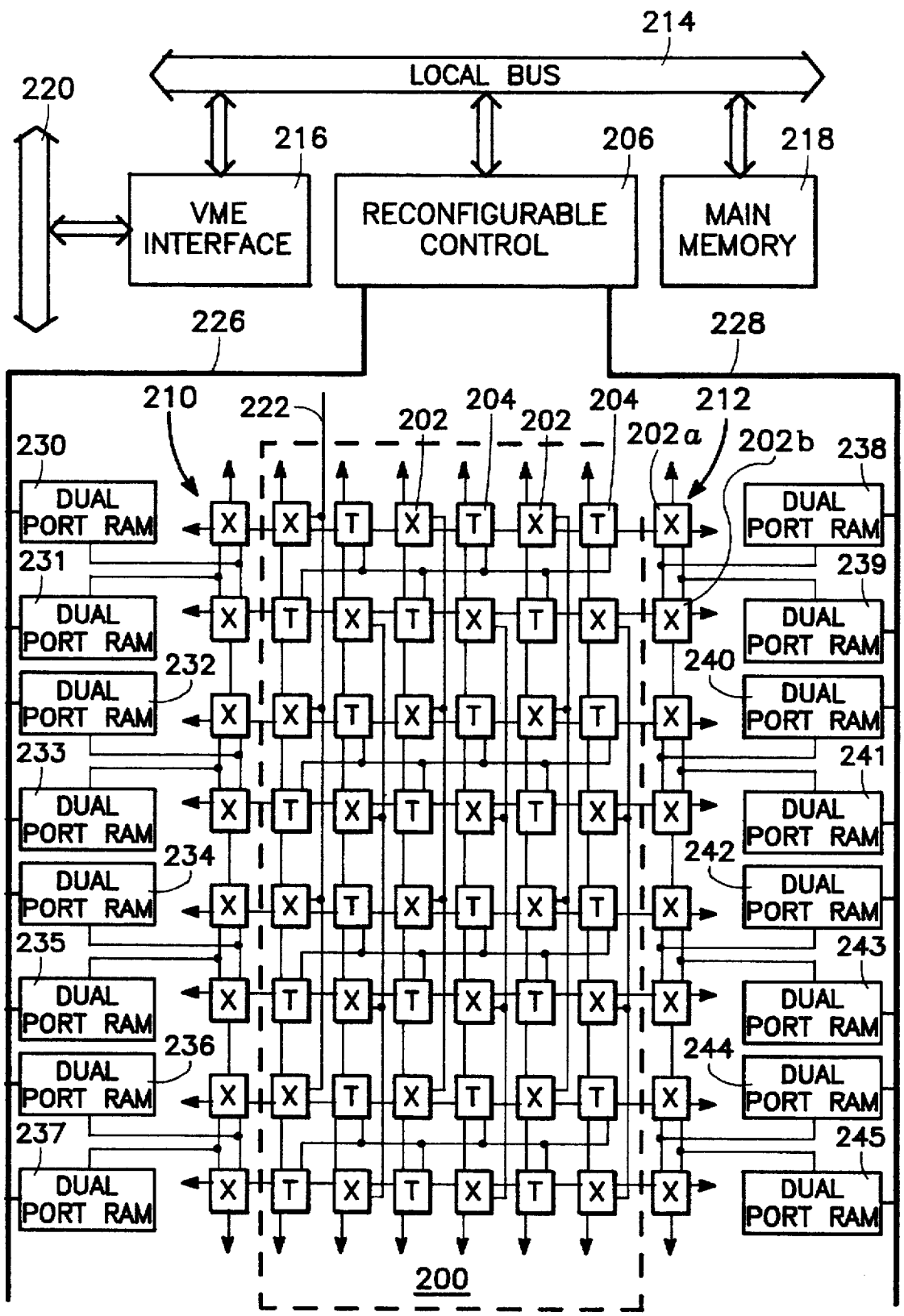
FIG. 12 is a block diagram of a virtual computer embodying the invention, including an array of FPGAs and FPINs comprising many cells of the type illustrated in FIG. 11.

FIG. 12 illustrates an array 200 of FPGAs 202 and FPINs 204 comprising many elementary cells of the type illustrated in FIG. 1. The array 200 of FIG. 12 may be employed as a co-processor to enhance the performance of a host computer. However, in accordance with a further aspect of the present invention, the array 200 is comprised within a virtual computer illustrated in FIG. 12. The virtual computer of FIG. 12 is capable of successively reconfiguring the FPGAs and FPINs in the array 200 to perform successive algorithms, in analogy with a conventional microprocessor executing a set of successive instructions. However, each one of the successive algorithms performed by the virtual computer of FIG. 12 may correspond to many conventional instructions to be executed by a conventional microprocessor. Thus, rate at which the FPGAs and FPINs in the array 200 are successively reconfigured in performing a large computational task is less than the rate at which corresponding individual instructions would have to be loaded into a conventional microprocessor attempting to perform the same computational task at the same speed. In fact, therefore, by reconfiguring the FPGAs and FPINs in the array 200 at the maximum possible rate, the array 200 can perform a large computational task much faster than a conventional microprocessor.

For this purpose, the virtual computer of FIG. 12 includes a reconfigurable control section 206 governing the reconfiguration of all of the FPGAs and FPINs in the array 200 and capable of running software packages such as the LDG and FPID Pro software packages to generate the configuration bit files. Each configuration bit file thus generated is transmitted by the reconfigurable control section 206 to the corresponding FPGA or FPIN in the array 200.

The array 200 is connected to its left and to its right to respective columns 210, 212 of eight FPGAs (hereinafter, "column FPGAs"), alternate pairs of column FPGAs connected to pairs of dual port RAMs whose other ports are connected to the reconfigurable control section 206. A local bus 214 provides connection between the reconfigurable control section 206, a bus (VME) interface 216 and a main memory 218. The bus interface 216 is connected to a system bus 220. The 32-pin banks of the FPGAs 202 and FPINs 204 in the top row of the array 200 corresponding to the upward pointing arrows are connected to the 32-pin banks of the FPGAs 202 and FPINs 204 in the bottom row of the array 200 corresponding to the downward pointing arrows.

Figure 13:
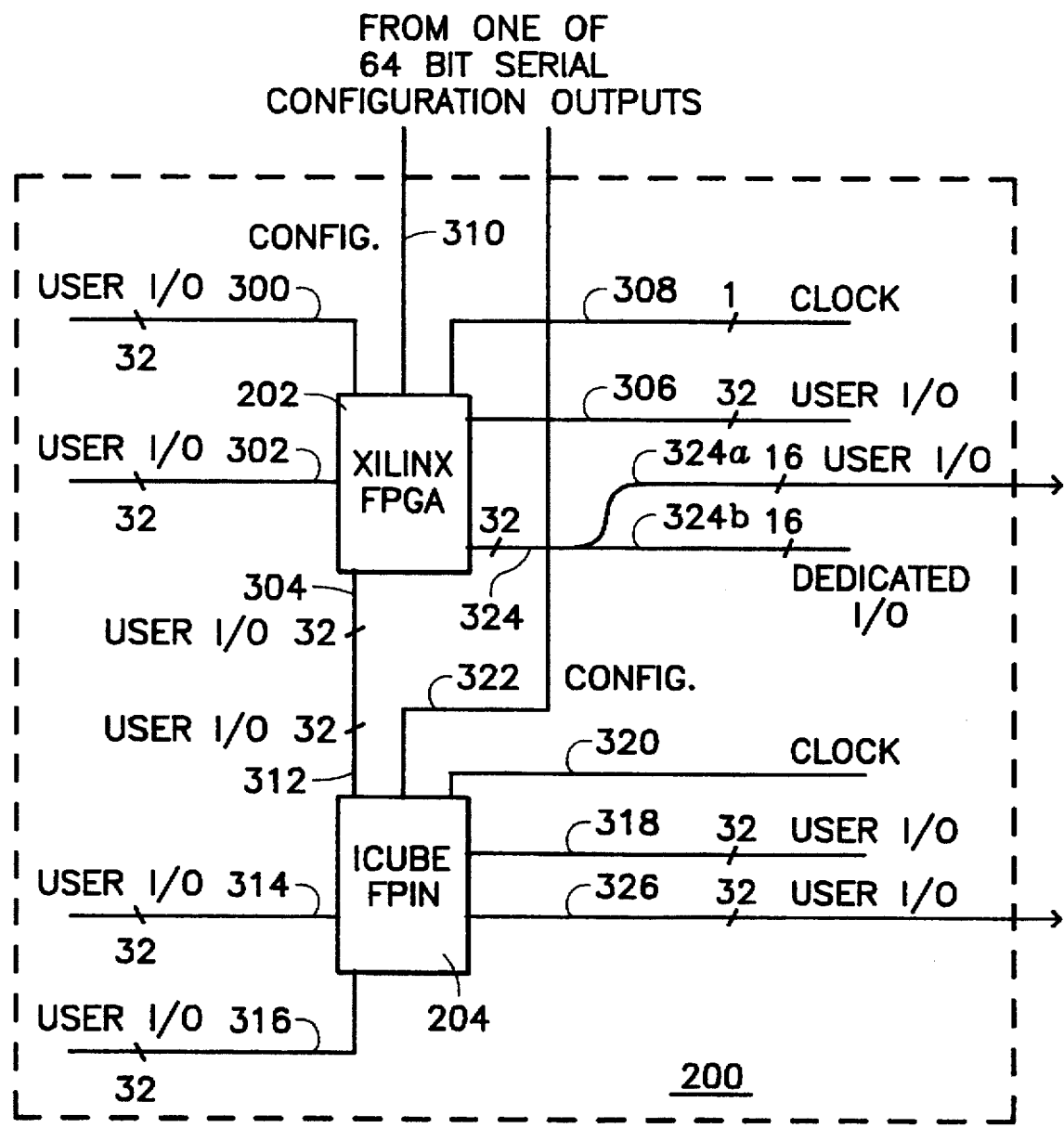
FIG. 13 is a block diagram illustrating pin connections between an FPGA chip and adjacent FPIN chip in the cell of FIG. 11.

As illustrated in FIG. 13, each FPGA 202 in the array 200 has four banks 300, 302, 304, 306 of thirty-two user I/O pins on its four sides connected to corresponding banks of thirty-two pins of four different FPINs 204. In addition, each FPGA 202 has a clock signal pin 308 and a configuration bit input pin 310 on which it receives the corresponding configuration file generated by the LDG software package executed by the reconfigurable control section 206. Each FPIN 204 in the array 200 has four banks 312, 314, 316, 318 of thirty-two pins on its four sides connected to corresponding banks of thirty-two pins of four different FPGAs 202. In addition, each FPIN has a clock signal pin 320 and a configuration bit input pin 322 on which it receives the corresponding configuration file generated by the FPID Pro software package executed by the reconfigurable control section 206.

Figure 14:
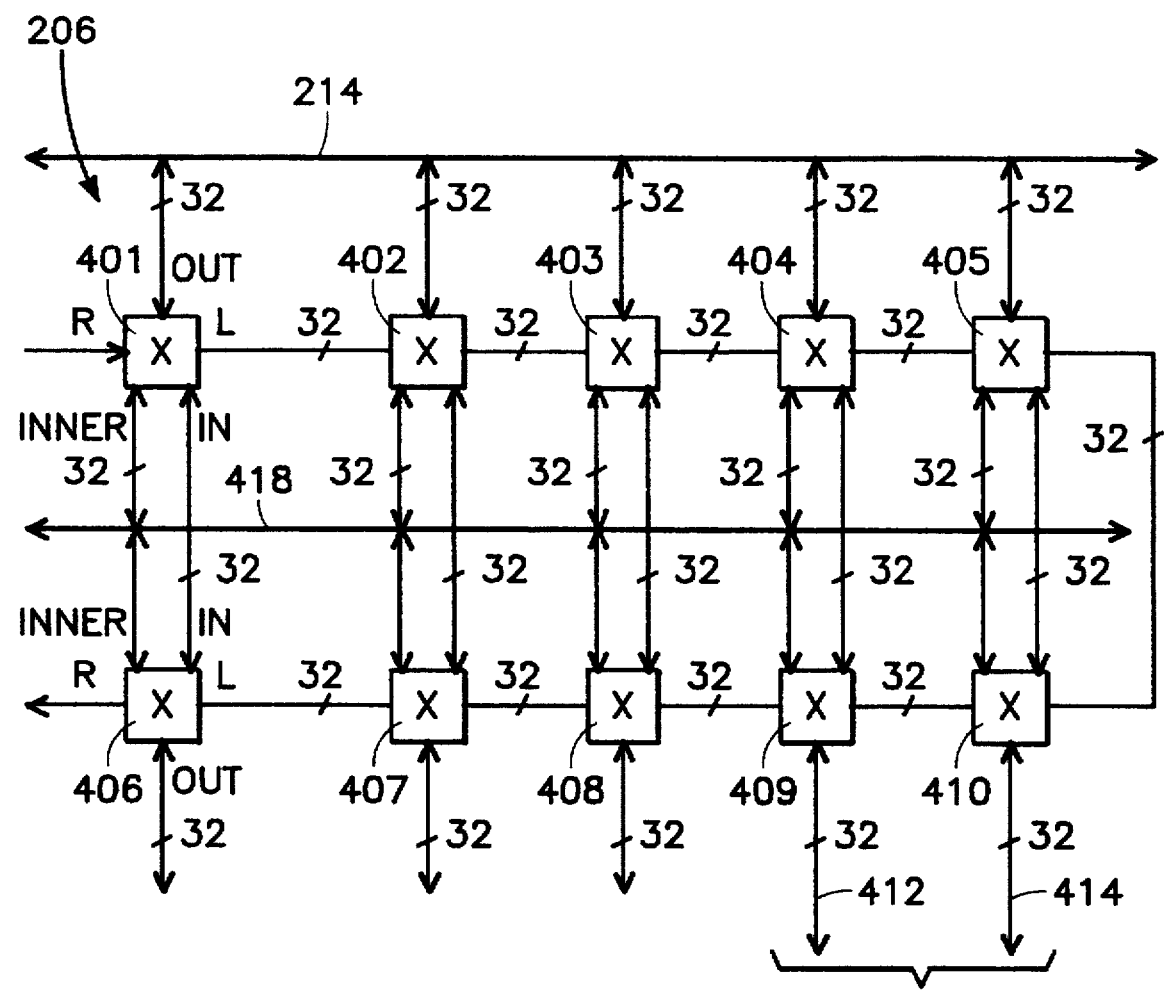
FIG. 14 is a block diagram of a reconfigurable control section of the virtual computer of FIG. 12.

FIG. 14 illustrates a preferred embodiment of the reconfigurable control section 206. The reconfigurable control section 206 of FIG. 14 has ten FPGAs 401-410 each identical to the FPGAs 202 in the array 200. The ten FPGAs 401-410 are connected directly together in this embodiment without the use of FPINs. In accordance with one aspect of the invention, the ten FPGAs 401-410 are configured using the LDG software (run on an external host not shown in FIG. 14) to emulate a standard microprocessor (such as a Motorola 68000). Once this is completed, the reconfigurable control section 206 is then used to run the LDG and FPID Pro software packages to generate the configuration bit files for reconfiguring the FPGAs 202 and FPINs 204 of the array 200 in accordance with a process to be described later herein. In order to load the configuration bit streams or files into each of the FPGAs 202 and FPINs 204 independently or simultaneously, some of the user I/O pins 412, 414 of each of the last two FPGAs 409, 410 of the reconfigurable control section 206 serve as configuration bit output pins dedicated to transmitting the configuration bit files to different ones of the FPGAs 202 and FPINs 204 in the array 200. For this purpose, different ones of the configuration bit output pins 412, 414 are individually connected to different configuration bit input pins 310 of the FPGAs 202 while others of the configuration bit output pins 412, 414 are individually connected to different configuration bit input pins 322 of the FPINs 204. The reconfigurable control section 206 is programmed to output the various configuration bit output files it has generated for the various FPGAs 202 and FPINs 204 on corresponding ones of the configuration bit output pins 412, 414. In the implementation illustrated in FIGS. 2, 3 and 4, the array 200 consists of exactly 24 FPGAs and 24 FPINs. In addition (for reasons that will be discussed later in this specification), the array 200 is bounded on its left and right (as viewed in FIG. 12) by left and right columns 210, 212, respectively, of consisting exclusively of exactly 8 FPGAs in each column, for a total of 16 additional FPGAs. Thus, there is a total of 40 FPGAs and 24 FPINs controlled by the reconfigurable control section 206, requiring a total of 64 configuration bit output pins. In order to meet this requirement, the configuration bit output bits 412, 414 comprise one bank of thirty-two user I/O pins on each one of the last two FPGAs 409, 410 of the reconfigurable control section 206.

In FIG. 14, the FPGAs 401 in the top row and 406 in the bottom row are typical, but are rotated with respect to one another in the horizontal plane by 180 degrees. Each one has five banks (labelled OUT, IN, RIGHT, LEFT and INNER, respectively) of thirty-two pins each. In the reconfigurable control section 206, each one of the five banks participates in one of five connections. Specifically, the top five FPGAs 401, 402, 403, 404, 405 have their OUT banks connected to a local bus 214 while the bottom five FPGAs 406-410 have their OUT banks connected to the array 200. Of the latter, the OUT banks of the FPGAs 409 and 410 are the configuration bit output pins 412 and 414 discussed above, while the connection of the OUT banks of the FPGAs 406-408 to the array 200 will be discussed later in this specification. All ten FPGAs 401-410 have their IN banks of pairs of top and bottom FPGAs connected together, their INNER banks connected to an inner bus 418 and their LEFT and RIGHT banks connected to provide left-to-right pipeline connectivity. The inner bus 418 facilitates the reconfiguration of the array of FPGAs 401-410 in a microprocessor architecture capable of running object code compiled for a particular microprocessor. The LEFT bank of the FPGA 410 and the RIGHT bank of the FPGA 406 provide data ports, as do the local bus 214 and the inner bus 418.

The five banks of 32 pins of each FPGA 202 in the array 200 are allocated in the manner illustrated in FIGS. 2 and 3. Specifically, the four banks 300, 302, 304, 306 provide connection to the four adjacent FPINs 204 (i.e., to the top, bottom, left and right of each FPGA 202). A fifth bank 324 of thirty-two pins is divided in half, one sixteen-pin half bank 324a being used for interconnection to the fifth banks of all FPGAs 202 in the same column using a column global bus 222. Thus, each column global bus is a 16-bit bus. The other sixteen-pin half bank 324b is dedicated to control functions listed as "Permanently Dedicated Pins" on page 34 of the Xilinx technical manual for the XC4000 FPGA entitled *Xilinx Technical Data XC4000 Logic Cell Array Family* (1990).

List of 16 I/O pin used as dedicated pins in the Array

TDI USED FOR BOUNDRY SCAN

TDO "

TCK "

TMS "

M0 USED FOR CONFIGURATION MODE

M1 "

M2 "

INIT CONFIGURATION CONTROL AND STATUS

DIN CONFIGURATION DATA IN

PGCK1-4 TIED TO SYSTEM CLOCK

SGCK1-3 GLOBALLY TIED TOGETHER FOR GLOBAL MESSAGES.

The five banks of 32 pins of each FPIN 204 in the array 200 are allocated in the manner illustrated in FIGS. 2 and 3. Specifically, the four banks 312, 314, 316, 318 provide connection to the four adjacent FPGAs 202 (i.e., to the top, bottom, left and right of each FPIN 204). A fifth bank 326 of thirty-two pins is used for interconnection to all fifth banks of all FPINs 204 in the same row using a row global bus 224. Thus, each row global bus 224 is a 32-bit bus. There are four column busses 222 and four row busses 224. The row and column busses 222 and 224 enable global communication among the FPGAs 202 and the FPINs 204 respectively.

As described above with reference to FIG. 14, data flow between the reconfigurable control section 206 and the array 200 occurs at the 32-pin OUT banks of the FPGAs 406, 407 and 408 of the control section 206. For this purpose, array buses 226, 228 are connected to the 32-pin OUT banks of the FPGAs 406-408 and to the left and right FPGA columns 210 and 212 via dual port RAMs 230-245. The dual port RAMs 230-245 provide buffering between the data bursts received on the system bus 220 and the synchronous operation of the array 200.

The five 32-pin banks of each FPGA 202 in the left and right FPGA columns 210 and 212 may be labelled LEFT, RIGHT, OUT, IN and INNER in the same manner as the FPGA 406 of FIG. 14. With this analogy in mind, the connections between the dual port RAMs 230-245 and the left and right FPGA columns 210 and 212 are typified by the connection of the FPGA 202a at the top of the right FPGA column 212, as follows. The FPGAs in each column 210, 212 are paired, the IN and INNER banks of each FPGA within a pair being connected together and to a respective one of a pair of the dual port RAMs. Thus, the FPGA 202a is paired with the next FPGA down in the right FPGA column 212, namely the FPGA 202b. In the specific case of the FPGA 202a, the LEFT bank connects to the adjacent FPIN in the same row while the RIGHT bank is wrap-around connected to the left bank of the FPGA in the same row of the left FPGA column 210, the OUT bank is wrap-around connected to the OUT bank of the bottom FPGA of the right FPGA column 212. The OUT bank of the FPGA 202b is connected to the OUT bank of the next FPGA down in the same column. Thus, the right and left FPGA columns 210 and 212 are connected around the array 200 to each other from left to right, as indicated by the arrows extending away from the array 200. This latter feature, along with the top to bottom wrap around connection between the top and bottom rows of FPGAs and FPINs in the array 200 (described previously herein), connects the entire array 200 on a three-dimensional surface like a cube or sphere.

Figure 15:
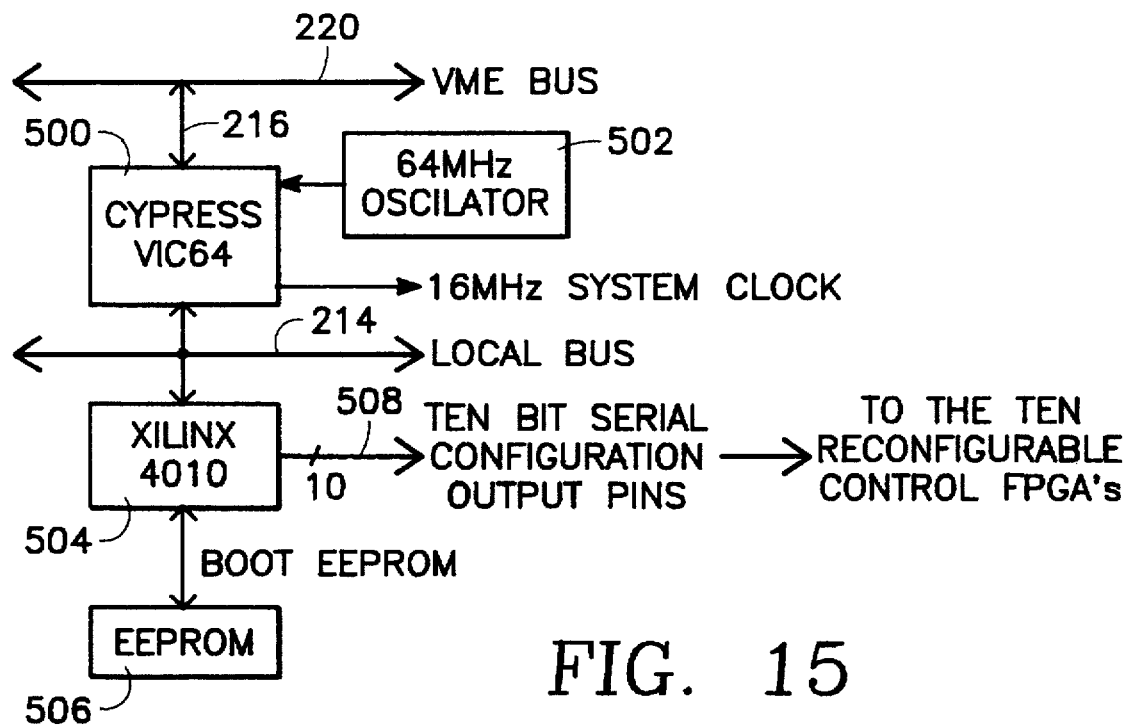
FIG. 15 is a block diagram of the VME interface section of the virtual computer of FIG. 12.

Referring to FIG. 15, the system bus 220 is a VME bus in one implementation and the bus interface 216 includes a VME interface chip 500, namely a Cypress VIC64 driven by a 64 MHz oscillator 502, connected to the system bus 220 at one port and to the local bus 214 at another port. A boot-up FPGA 504 has one set of its pins connected to the local bus 214 and another set of its pins connected to a boot EEPROM 506. Furthermore, the boot-up FPGA 504 has ten configuration bit output pins 508 connected to the configuration bit input pins (corresponding to pin 310 of FIG. 13) of the ten FPGAs 401-410 of the reconfigurable control section 206. The EEPROM 506 contains instructions which control and configure the boot-up FPGA 504 when power is first applied. These instructions cause the boot-up FPGA 504 to transmit via the ten output pins 508 ten configuration files to the configuration bit input pins of the ten FPGAs 401-410 of the reconfigurable output section 206. In a preferred embodiment, the information stored in the boot-up EEPROM 506 corresponds to the configuration files necessary to configure the FPGAs 410-410 in a microprocessor architecture. The EEPROM also enables the boot-up FPGA 504 to control the VME interface chip 500 in conformance with the configuration of the VME system bus 220.

Figure 16:
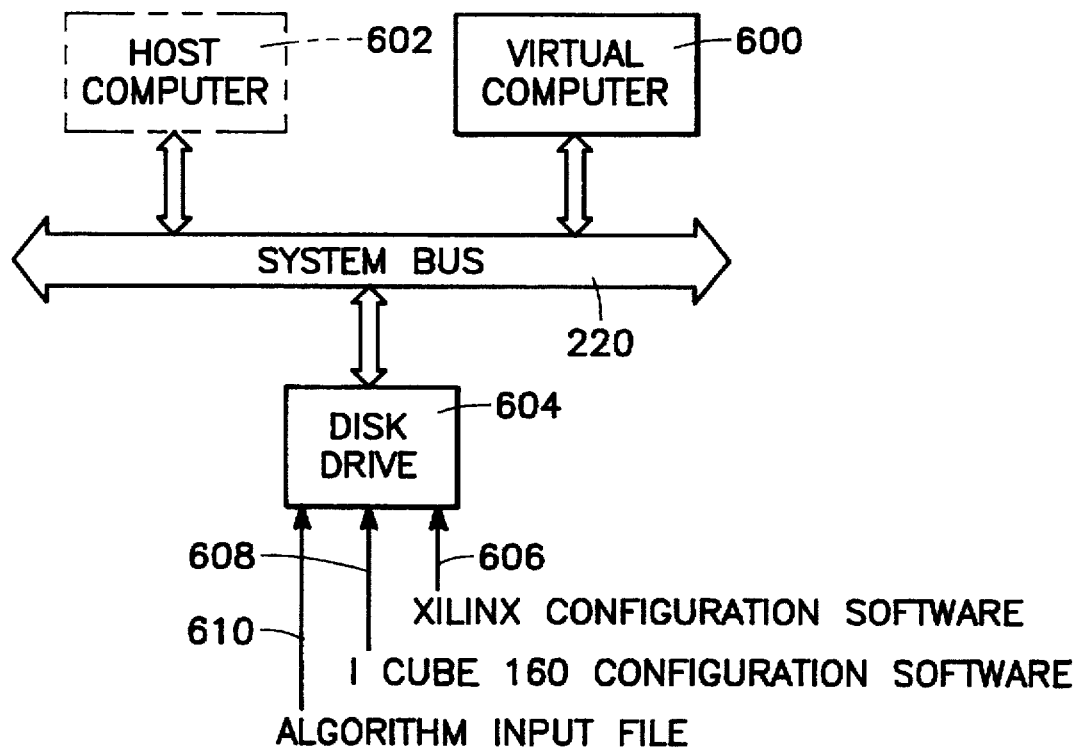
FIG. 16 is a block diagram of a virtual computing system, including a host computer temporarily connected to the system bus for initially programming the virtual computer.

FIG. 16 illustrates how to configure the virtual computer 600 of FIG. 12 immediately upon completion of manufacture. Specifically, a host computer 602 is connected to the system bus and a disk drive 604 is also connected to the bus 220. Software 606 such as the LDG program for configuring an array of Xilinx FPGAs is stored in the disk drive 604. Also, information specifying the configuration bit output pins 504a of the boot-up FPGA 504 and their assignment among the ten FPGAs of the reconfigurable control section 206 is stored in the disk drive 604. Finally, an array 610 of logic primitives corresponding to a selected microprocessor logic architecture (such as the logic architecture of the Motorola 68000 microprocessor) is stored on the disk drive 604. Then, the host computer 602 is instructed to run the LDG software package to process the array of logic primitives and generate configuration bit files for each of the ten FPGAs of the reconfigurable control section 206. These configuration bit files are then stored on the disk drive 604. Thereafter, they are used to program the boot-up EEPROM 506 so that the configuration files are downloaded into the corresponding control section FPGAs 401-410 and the system automatically configures the control section 206 to emulate the selected microprocessor each time it boots up. Thereafter, the system is a virtual computer ready to perform any user-defined algorithm.

As one option, the EEPROM 506 may store information enabling the system to boot up into one of several (e.g. eight) predetermined microprocessor configurations, depending upon a user-specified choice, enabling the user to instantly switch the system from one microprocessor architecture to another, as desired.

Figure 17:
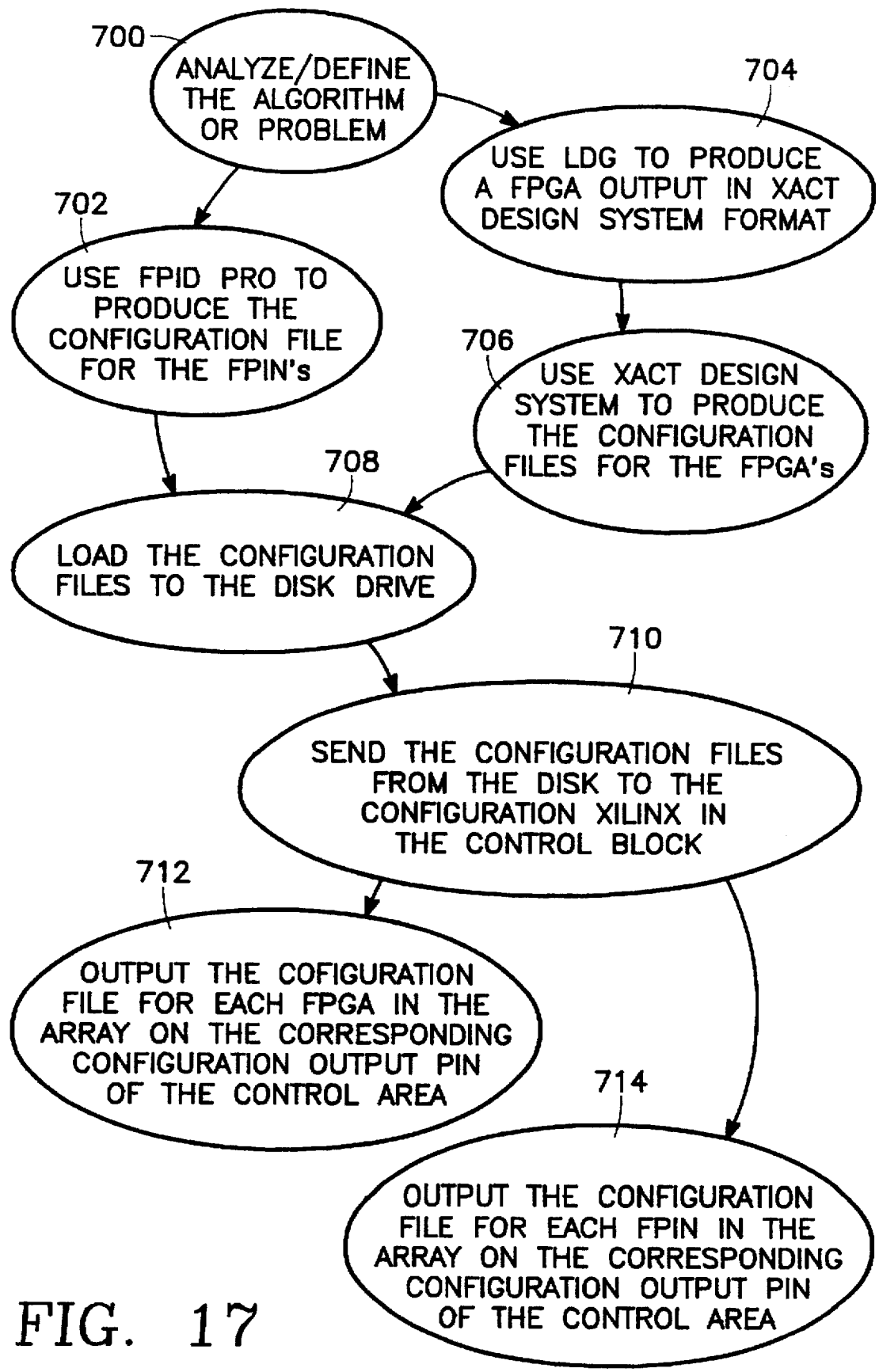
FIG. 17 is a flow diagram of a process employing configuration software applicable to the FPGAs and the FPINs for configuring the virtual computer of FIG. 12.

FIG. 17 illustrates one mode of operation of the virtual computer of the invention. The step of block 700 of FIG. 17 is to analyze and define the current algorithm to be performed. This step requires dividing the algorithm into a number of sub-algorithms corresponding to the number of FPGAs in the array 200, and defining logical connections between the sub-algorithms. Next, the step of block 702 of FIG. 17 is to use the FPID Pro software to produce the configuration file for the FPINs from the logical connections defined in the step of block 700. Then, block 704 of FIG. 17 is to use the LDG software to produce an FPGA output in Xact Design System Format for each FPGA in the array 200 from each one of the sub-algorithms defined in the step of block 700. Next, the step of block 706 is to use the Xact Design System software to produce the configuration files for the FPGAs. Next, the step of block 708 is to load the configuration files to the disk drive. Then, the step of block 710 is to send the configuration files from disk to configuration FPGAs 409, 410 in the control section 206. Next, the step of block 712 is to output the configuration file for each FPGA in the array on the corresponding pin in the two banks 412, 414 of configuration bit output pins in the control section 206. Last, step of block 714 is to output the configuration file for each FPIN in the array on the corresponding configuration bit output pin. The array is then enabled to perform the algorithm. Step 700 is then repeated for the next algorithm to be performed, and then the remaining steps 702 et seq. are repeated. In this manner a succession of algorithms are performed.

Figure 18A:
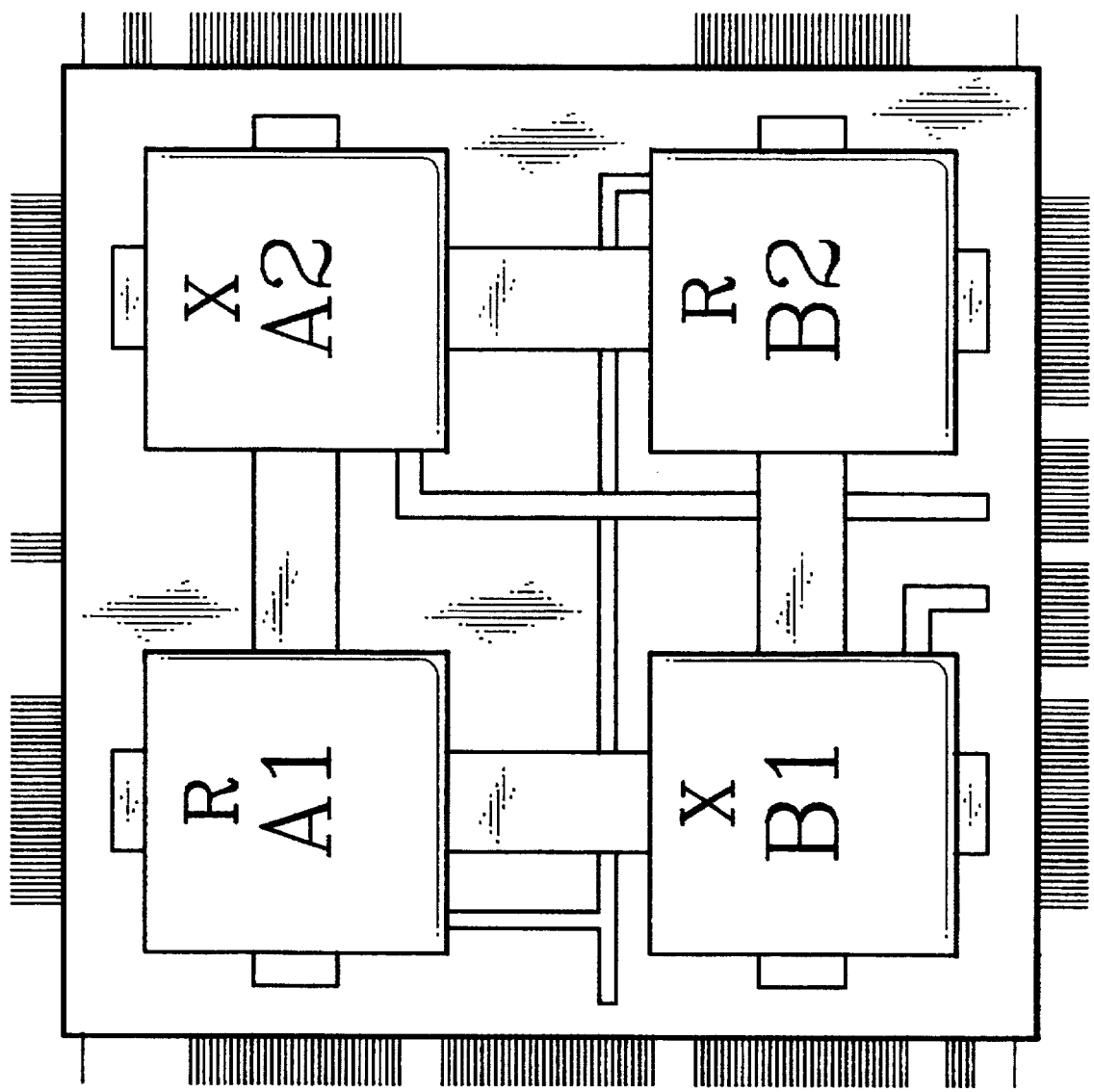
FIGS. 18a and 18b are pin diagrams illustrating one implementation of the elementary cell of FIG. 11.
Figure 18B:
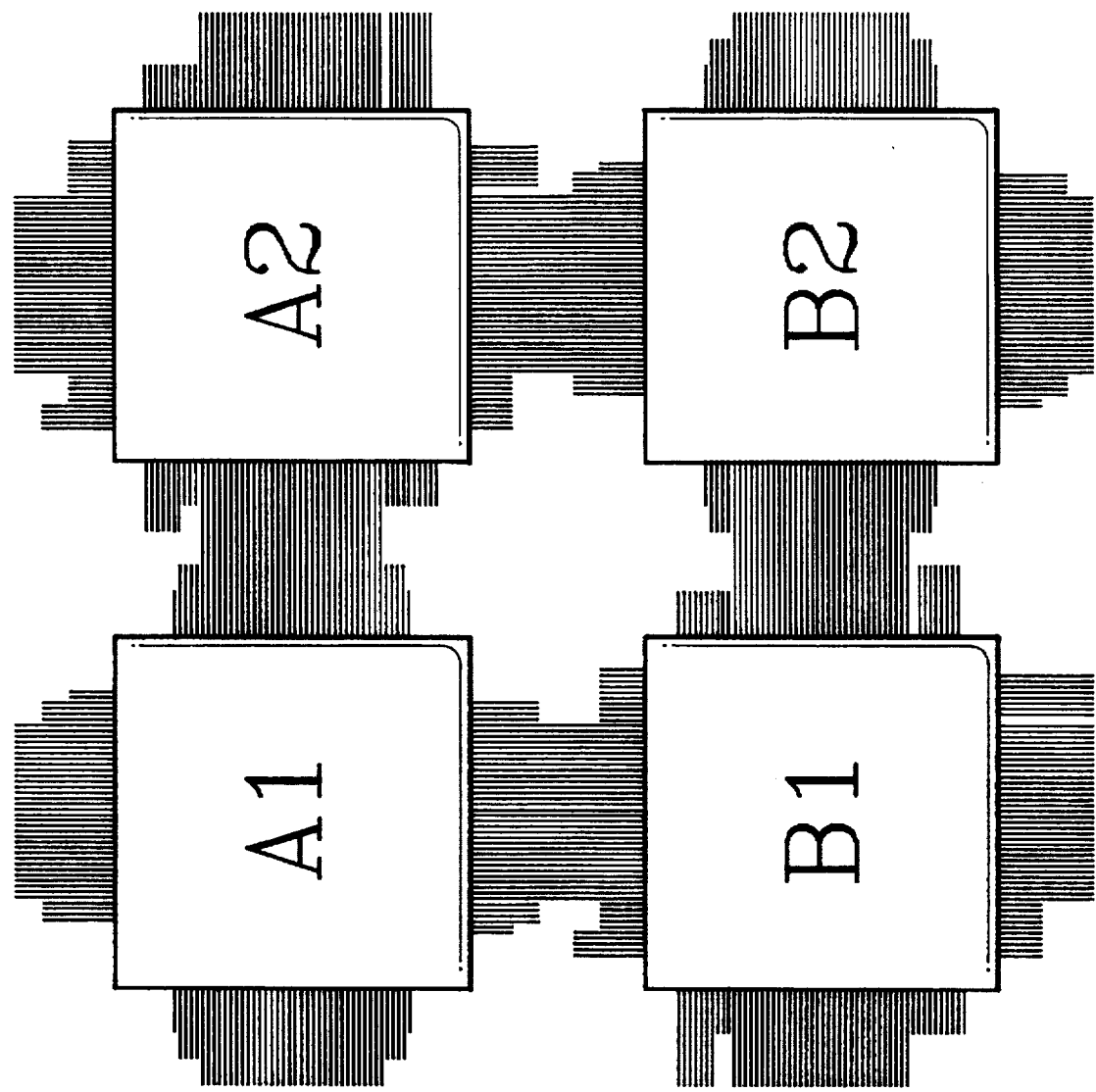
Figure 19:
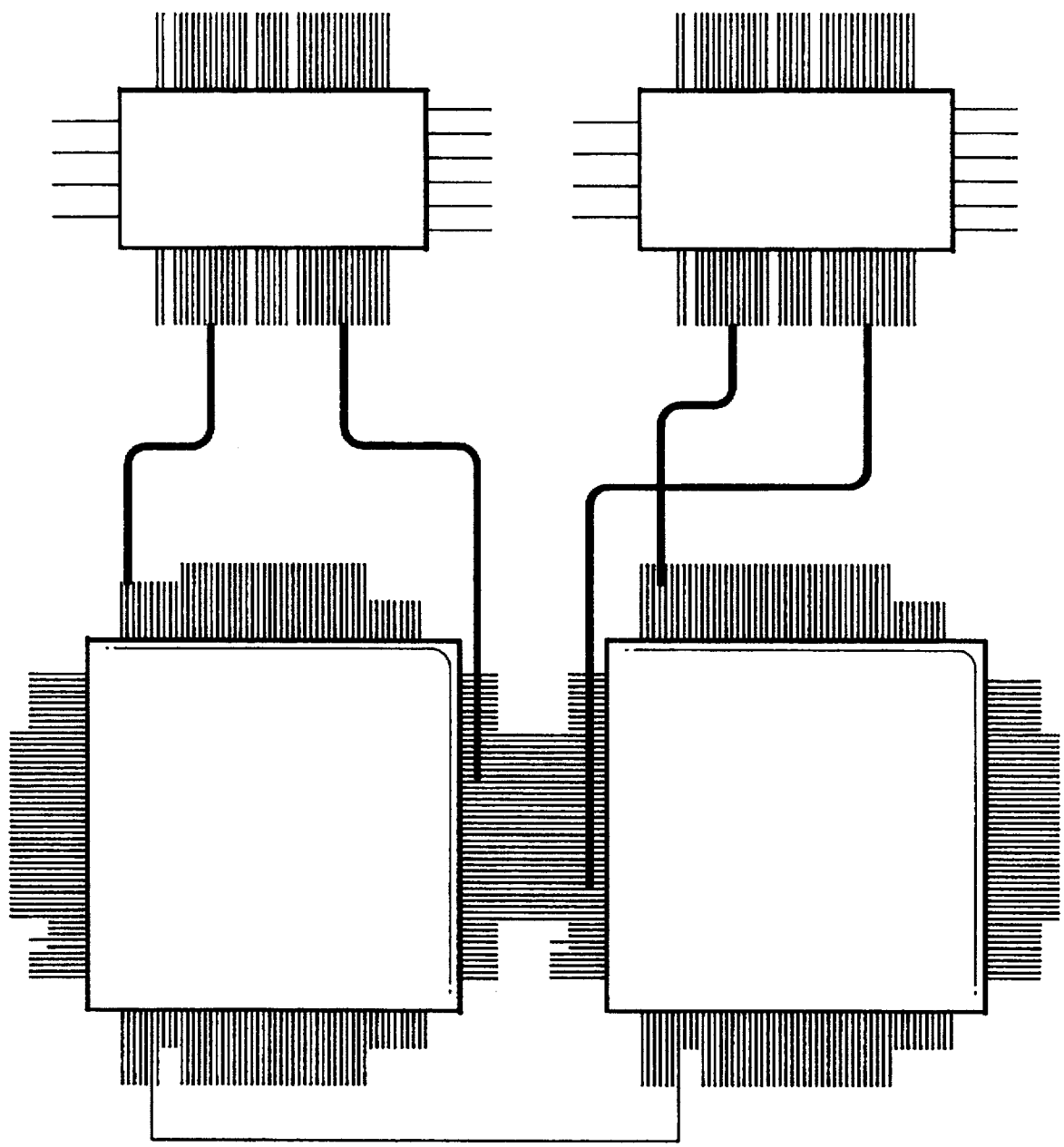
FIG. 19 is a pin diagram of the interconnection between the edge columns of FGPAs and the dual port RAMs in the virtual computer of FIG. 12.

FIGS. 18a and 18b are pin diagrams corresponding to one implementation of the elementary cell of FIG. 1. FIG. 19 is a pin diagram illustrating the connection of a pair of dual-port RAMs to a pair of FPGAs in the right FPGA column 212.

Figure 20:
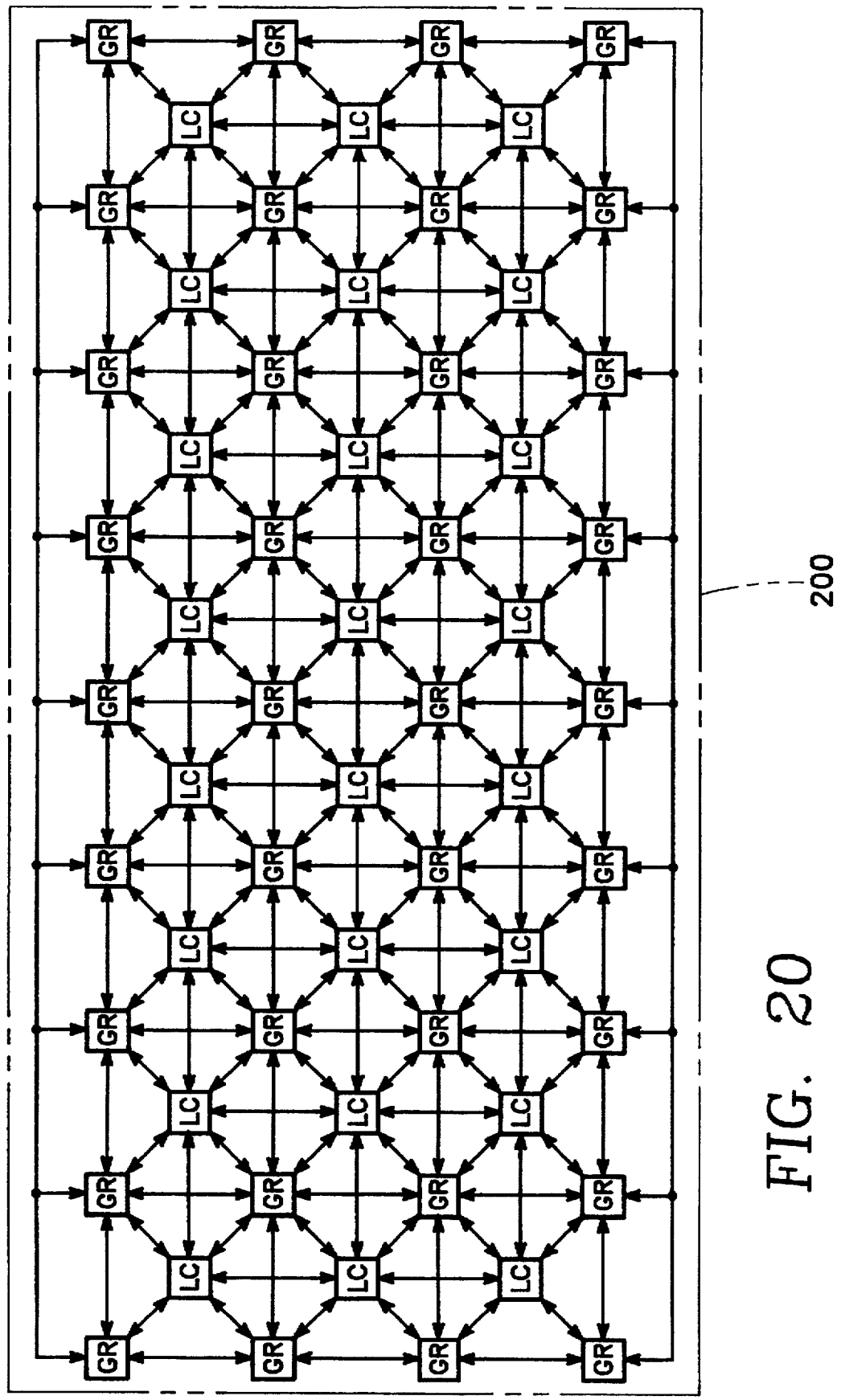
FIG. 20 is a block diagram of an alternative embodiment of an array of FPGAS and FPINs.

FIG. 20 illustrates an alternative embodiment of the array 200 in which each FPGA is connected not only to the four neighboring FPINs (as in FIG. 12) but also to the four neighboring FPGAs, while each FPIN is similarly connected not only to the four neighboring FPGAs (as in FIG. 12) but also to the four neighboring FPINs.

As described above, the FPIN is a multi-pin device which connects any one of its pins with any one of its other pins. The preferred embodiment of the FPIN is an array of two-channel general routing cells (GRCs) of the type illustrated in FIG. 21. This type of FPIN permits one set of configuration files (corresponding to a first algorithm to be performed) to control the FPIN while a second set of configuration files (corresponding to a second algorithm to be performed next) is shifted in through all the cells of the FPIN. The successive bits of the first configuration bit file arrive on data in A (DINA) line 1102, while the successive bits of the second configuration bit file arrive on data in B (DINB) line 1104. A clock signal arrives on clock (CLK) line 1108 and the A/B channel select bit arrives on line 1108. The DINA and DINB bits are stored respectively in D flip flops 1110 and 1112. The clock line 1108 and the channel select line 1108 are connected to the data and select inputs, respectively, of a demultiplexer, whose Y0 and Y1 outputs are applied to the clock inputs of the D flip flops 1110 and 1112 respectively. The Q0 outputs of the D flip flops 1110 and 1112 are routed on data out A (DOUTA) and data out B (DOUTB) lines 1116 and 1118, respectively, to the next (DINA) and (DINB lines 1102, 1104 of the next GRC cell in the array, and also to the D0 and D1 inputs, respectively, of a multiplexer 1120. The multiplexer 1120 applies one of its inputs, D0 or D1, to its Y output, depending upon the state of the A/B signal applied to the select input of the multiplexer 1120. The Y output of the multiplexer 1120 is a bit which determines whether a bi-state switch 1122 (connecting two pins via horizontal and vertical interconnects 1124, 1126) is on or off.

Figure 21:
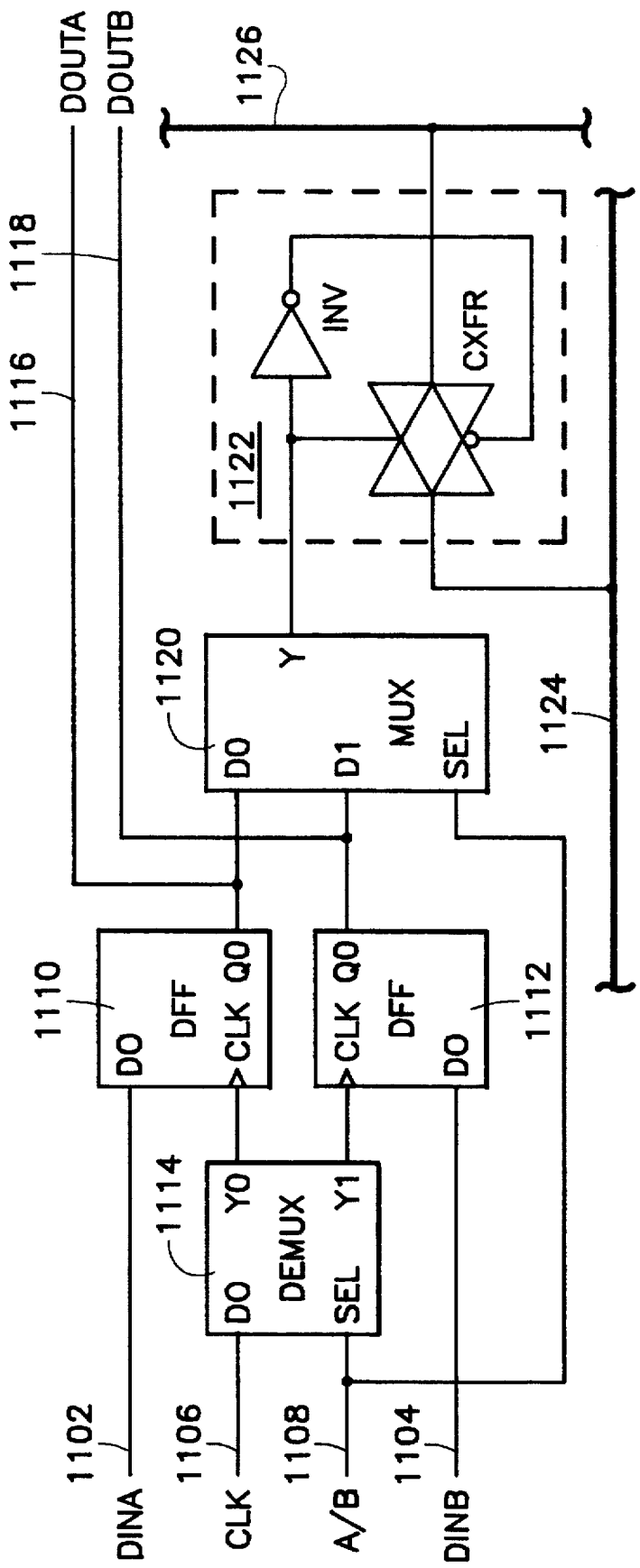
FIG. 21 is a circuit diagram of a general routing cell of the invention.
Figure 22:
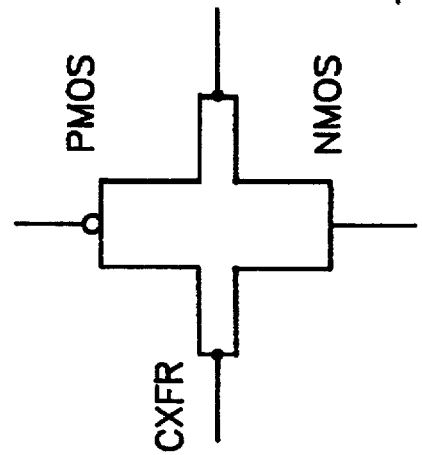
FIG. 22 is a circuit diagram of a CMOS version of the interconnect switch employed in the GRC cell of FIG. 21.

The GRC cell of FIG. 21 operates as follows: If the A/B bit is high, then the flip flop 1110 holding the A data (DINA) is clocked so that the A data propagates to the next GRC cell via the data A out (DOUTA) line 1116, while simultaneously the flip flop 1112 holding the B data is not clocked so that the B data is held stationary and does not propagate. Instead, the B data bit held in the flip flop 1112 is applied through the multiplexer 1120 to the control input of the switch 1122. This status is maintained as long is it takes one complete configuration bit file to serially propagate through all the GRC cells of the array, until the first bit arrives at the last GRC cell in the serial propagation path. Then, the A configuration data is in place and all the GRC cells in the array are ready to be switched over simultaneously to enable to A configuration data to reconfigure the array. This occurs whenever the A/B channel select signal reverses its state to a low logic state. The multiplexer now applies the clock signal to the flip flop 1112 so that the B data propagates to the next cell on the DOUTA line 1118 while the A data is held stationary in the flip flop 1110. Moreover, the A data stored in the flip flop 1110 is applied by the multiplexer 1120 to the control input of the switch 1122.

The switch 1122 is preferably a CMOS switch of the type illustrated in FIG. 12 in which the output from the multiplexer 1120 is inverted at the gate of the PMOS device but not at the gate of the NMOS device.

Figure 23:
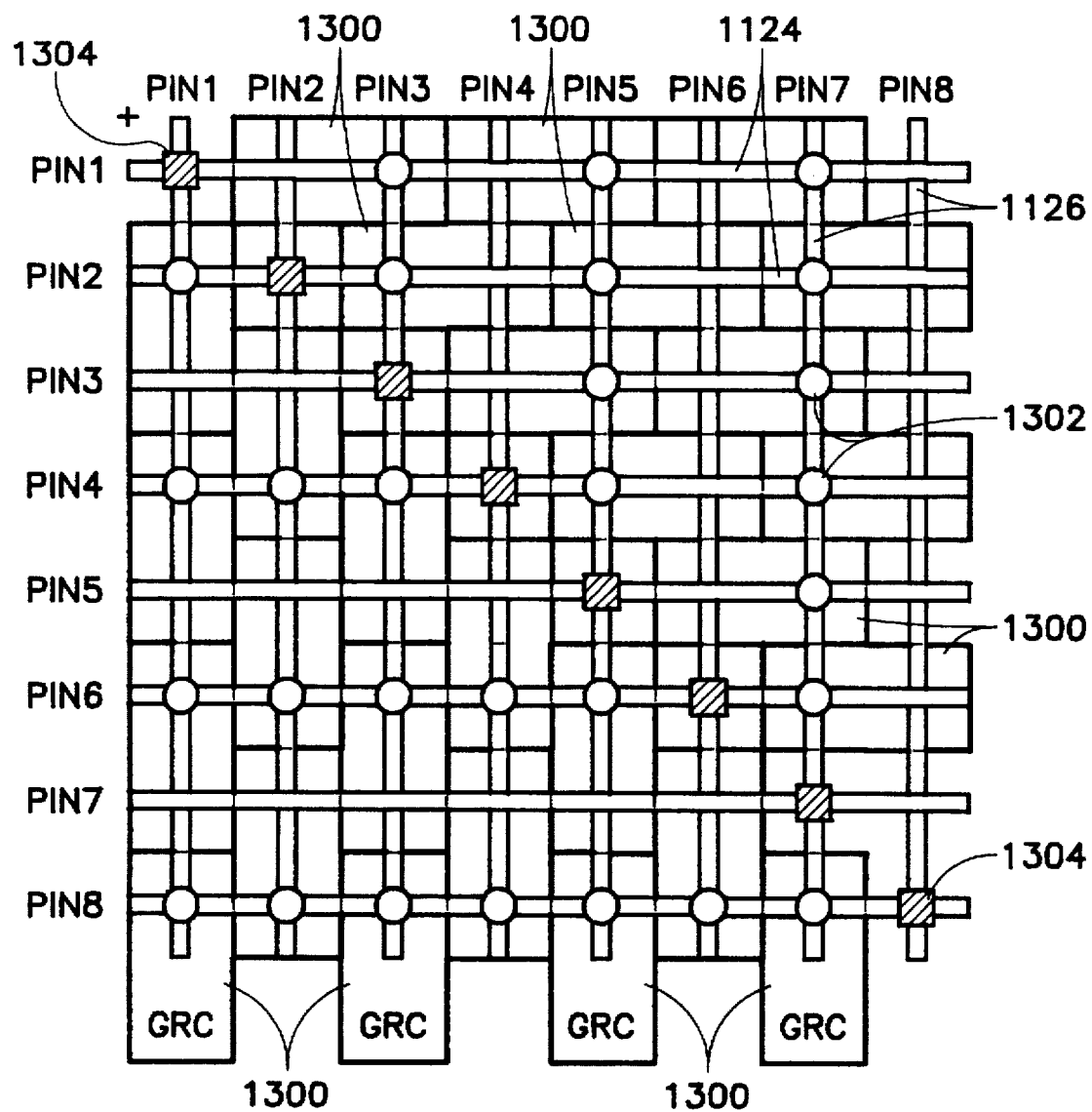
FIG. 23 is a block diagram illustrating horizontal and vertical interconnections in an array of GRC cells of the type corresponding to FIG. 21.

An array of individual GRC cells constituting an 8-pin FPIN in which any pin is programmably connectable to any other pin is illustrated in FIG. 23. Each GRC cell is a rectangular substrate 1300 with top layer metal patterns providing the horizontal and vertical interconnects 1124, 1126 and circuitry for the switch 1122 at the intersection of the horizontal and vertical interconnects and lower layer metal patterns providing the connections between the DOUTA, DOUTB lines of each cell to the DINA, DING lines of the next cell. In addition, a pass-through (unswitched) horizontal interconnect 1302 is provided parallel to and below the horizontal interconnect 1124. In the array of FIG. 23, a second type of cell is used to provide permanent connections, and is a square substrate 1304 with horizontal and vertical interconnect metal patterns permanently connected at their intersection at the center of the substrate 1304. Horizontal or vertical interconnects 1124, 1126 or 1302 of adjacent substrates whose ends are in registration are electrically connected. Each of the programmable substrates 1300 is directional in that data flow to the next cell in the lower layer metal patterns is along the direction of the vertical interconnect 1126, of the top layer metal pattern with the end of the vertical interconnect 1126 nearest the switch 1122 being considered the "output" end of the substrate 1300.

Figure 24:
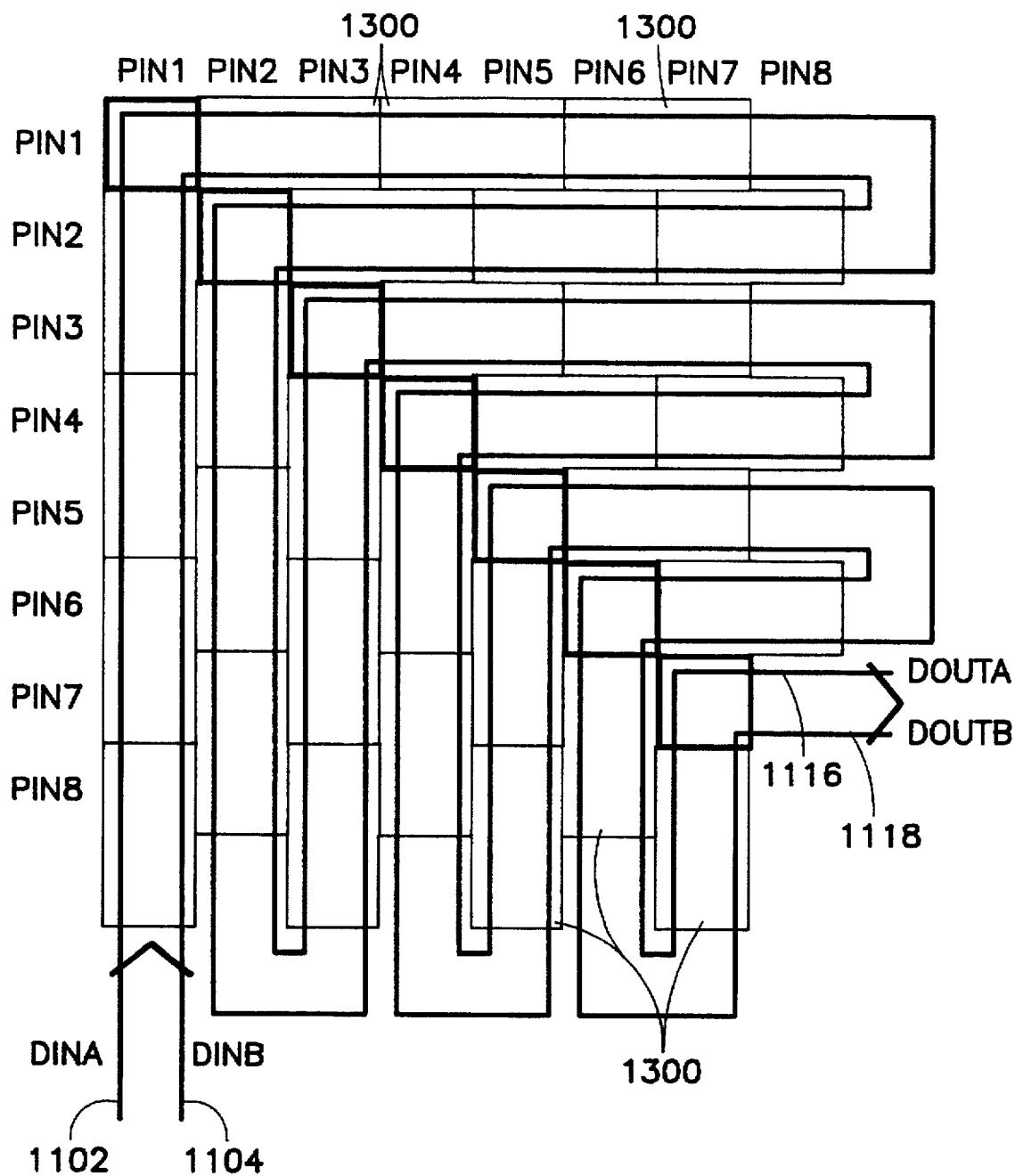
FIG. 24 illustrates the propagation of configuration data throughout the array of FIG. 23.

With the foregoing convention in mind, the layout of the cells in FIG. 23 is in a serpentine pattern, with eight permanent interconnection substrates placed in a diagonal line (block dots denoting the permanent connections). The lower layer metal patterns providing serial flow of configuration data bits through the array of FIG. 23 is illustrated in FIG. 24. It is the lower level metal pattern of FIG. 24 that connects the DOUTA and DOUTB lines 1116, 1118 of one GRC to the DINA and DINB lines 1102, 1104 of the next GRC. FIGS. 13 & 14 also indicate the serpentine pattern in which the GRC cell substrates 1300 are laid out. Generally, beginning at the bottom of the array, the programmable substrates 1300 are laid out in a vertical column end-to-end, the top of the column encountering a permanent connection substrate 1304, interfacing to its right with a horizontal row of programmable substrates 1300. At the right end of alternate rows, connection in the lower metal layer (FIG. 24) is provided to the right end of the next row down, and similarly at the bottom of alternate columns, connection in the lower level metal layer (FIG. 24) is provided to the bottom of the next column.

While the invention has been described in detail by specific reference to preferred embodiments, it is understood that variations and modifications thereof may be made without departing from the true spirit and scope of the invention.

What is claimed is:

1. A virtual network comprising:
  plural distributed virtual computers interconnected over a communication network of individual links;
  each distributed virtual computer comprising at least two respective ports each being connected over a respective link to another respective distributed virtual computer in the network;

each distributed virtual computer being connected to or resident within its own host computer;

each distributed virtual computer comprising reconfigurable FPGA logic elements, at least one of the FPGA elements being configured to have control capability over at least some of the remaining FPGA elements to react to instructions received from a host or from other nodes on the network to re-configure FPGA elements in the computation array to carry out a required task; and wherein at least the one or FPGA element is configured to have compiling capability to generate configuration bit files from received instructions defining how said at least some of said remaining FPGA elements are to be reconfigured so as to enable them to carry out said received instructions.

2. The virtual network of claim 1 wherein said one FPGA element configured to have control capability comprises plural FPGAs and said remaining FPGA elements comprises other plural FPGAs.

3. The virtual network of claim 1 wherein said one FPGA element configured to have control capability comprises FPGA elements on a single FPGA and said remaining FPGA elements comprise FPGA elements on another single FPGA.

4. The virtual computer of claim 1 wherein said one FPGA element configured to have control capability constitutes a portion of FPGA elements in a single FPGA.

5. The virtual computer of claim 1 wherein at least some of said remaining FPGA elements have a logic configuration suitable for executing tasks supporting a network protocol.

6. The virtual computer of claim 5 wherein at least some of said remaining FPGA elements have a logic configuration suitable for performing packet header translation.

7. A virtual network comprising:

plural distributed virtual computers, each of said plural distributed virtual computers being adapted for connection with a respective host;

plural communication links connecting each of said plural distributed virtual computers with at least two others of said plural distributed virtual computers;

each distributed virtual computer comprising:

(A) at least two respective ports each being connected to a respective one of said links;

(B) plural reconfigurable FPGA logic elements comprising:

(1) a control set of reconfigurable FPGA elements being configured to have control capability for compiling a request received from a host or from other nodes on the network to generate configuration bit files defining a logic configuration for carrying out a process corresponding to said request;

(2) a computation set of reconfigurable FPGA elements adapted to be reconfigured by said control set of FPGA elements in accordance with said configuration bit files so as to be capable of carrying out a corresponding process on operand data; and wherein at least the control set of FPGA elements are configured to have compiling capability to generate configuration bit files from received instructions defining how said computation set of FPGA elements are to be reconfigured so as to enable them to carry out processes corresponding to said received instructions.

8. The virtual network of claim 7 wherein said request comprises one of: (a) an instruction of a program, (b) a set of instructions, (c) a program, (d) an algorithm.

9. The virtual network of claim 7 wherein said control set of FPGA elements comprises plural FPGAs and said computation set of FPGA elements comprises other plural FPGAs.

10. The virtual network of claim 7 wherein said control set of FPGA elements comprises a first FPGA having plural FPGA elements and said computation set of FPGA elements comprise a second FPGA having plural FPGA elements.

11. The virtual computer of claim 7 wherein said control set of FPGA elements constitutes a portion of FPGA elements in a single FPGA.

12. The virtual computer of claim 7 wherein at least some of said FPGA elements have a logic configuration suitable for executing tasks supporting a network protocol.

13. The virtual computer of claim 7 wherein at least some of said FPGA elements have a logic configuration suitable for performing packet header translation.

14. A method of operating as a computer a reconfigurable node in a computer network of plural reconfigurable nodes interconnected by plural communication links, said reconfigurable node comprising reconfigurable logic array elements which are reconfigurable in accordance with a configuration bit file so as to become adapted to perform an operation in accordance with a predetermined reconfiguration algorithm which generates said configuration bit file from a definition of said operation, said method comprising:

storing an executable code defining a sequence of operations to be executed in sequence;

executing said executable code operation-by-operation in order of said sequence, said executing comprising:

at the time of the execution of at least one of said operations, computing exclusively from the portion of said executable code defining said one operation a corresponding configuration bit file representative of said one operation in accordance with said reconfiguration algorithm, and reconfiguring said reconfigurable node in accordance with said corresponding configuration bit file.

15. The method of claim 14 wherein said computing comprises performing at least a part of said reconfiguration algorithm on said portion of said executable code defining said one operation to obtain said corresponding configuration bit file.

16. The method of claim 15 wherein said part of said reconfiguration algorithm comprises at least a downloading function of said reconfiguration algorithm.

17. The method of claim 14 wherein said computing step is capable of producing any configuration bit file required to represent said one operation within the complete set of all configuration bit files of which said reconfiguration algorithm is capable of producing.

18. A method of operating a reconfigurable logic array which is reconfigurable in response to different configuration bit files defining different logic configurations adapted to perform different operations, said configuration bit files susceptible of being produced by a reconfiguration algorithm based upon definitions of said different operations, said method comprising:

storing an executable code defining a sequence of operations to be executed in sequence;

executing said executable code operation-by-operation in order of said sequence, said executing comprising:

at the time in said sequence for execution of at least one of said operations, computing exclusively from the portion of said executable code defining said one operation a corresponding configuration bit file representative of said one operation in accordance with said reconfiguration algorithm, and reconfiguring said reconfigurable logic array in accordance with said corresponding configuration bit file in time for said reconfigurable logic array to carry out said one operation in the order of said sequence.

19. The method of claim 18 wherein said computing comprises performing at least a part of said reconfiguration algorithm on said portion of said executable code defining said one operation to obtain said corresponding configuration bit file.

20. The method of claim 19 wherein said part of said reconfiguration algorithm comprises at least a downloading function of said reconfiguration algorithm.

21. The method of claim 18 wherein said computing step produces whatever configuration bit file is sufficient for said one operation within the complete set of all configuration bit files of which said reconfiguration algorithm is capable of producing.

22. The method of claim 18 wherein said computing comprises performing the entirety of said reconfiguration algorithm on said portion of said executable code defining said one operation to obtain said corresponding configuration bit file.

23. A method of operating a reconfigurable logic array reconfigurable in response to respective configuration bit files defining respective logic configurations into which said reconfigurable logic array can be configured, at least one of said respective logic configurations at a time, to perform respective operations, said respective configuration bit files susceptible of being produced by a reconfiguration algorithm based upon definitions of said respective operations, said method comprising:

storing an executable code comprising images of operations in a sequence of operations to be executed;

executing said executable code operation-by-operation in order of said sequence, said executing comprising:
at the time in said sequence for execution of at least one of said operations, computing exclusively from said image of the one operation a corresponding configuration bit file representative of said one operation in accordance with said reconfiguration algorithm, and
reconfiguring said reconfigurable logic array in accordance with said corresponding configuration bit file in time for said reconfigurable logic array to carry out said one operation in the order of said sequence.

24. The method of claim 23 wherein said image of said operation is a self-contained complete description of said one operation.

25. The method of claim 23 wherein said computing comprises performing at least a part of said reconfiguration algorithm on said image of said one operation to obtain said corresponding configuration bit file.

26. The method of claim 25 wherein said part of said reconfiguration algorithm comprises at least a downloading function of said reconfiguration algorithm.

27. The method of claim 26 wherein said computing comprises performing the entirety of said reconfiguration algorithm on said portion of said executable code defining said one operation to obtain said corresponding configuration bit file.

28. The method of claim 23 wherein said computing step produces whatever configuration bit file is sufficient to represent said one operation within the complete set of all configuration bit files of which said reconfiguration algorithm is capable of producing.

* * * * *